United States Patent
Katayama et al.

(10) Patent No.: US 8,675,393 B2
(45) Date of Patent: Mar. 18, 2014

(54) METHOD FOR DRIVING NON-VOLATILE MEMORY ELEMENT, AND NON-VOLATILE MEMORY DEVICE

(75) Inventors: Koji Katayama, Nara (JP); Takeshi Takagi, Kyoto (JP); Mitsuteru Iijima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/636,258

(22) PCT Filed: Mar. 18, 2011

(86) PCT No.: PCT/JP2011/001629
§ 371 (c)(1),
(2), (4) Date: Sep. 20, 2012

(87) PCT Pub. No.: WO2011/118185
PCT Pub. Date: Sep. 29, 2011

(65) Prior Publication Data
US 2013/0010530 A1    Jan. 10, 2013

(30) Foreign Application Priority Data
Mar. 25, 2010 (JP) .................................. 2010-070637

(51) Int. Cl.
*G11C 11/00* (2006.01)

(52) U.S. Cl.
USPC ............... 365/148; 257/8; 365/151; 365/163; 365/175; 365/180

(58) Field of Classification Search
USPC .......................... 365/148, 151, 163, 175, 180
See application file for complete search history.

(56) References Cited

U.S. PATENT DOCUMENTS 7,602,042 B2    10/2009 Ahn et al.
7,920,408 B2 *   4/2011 Azuma et al. ................. 365/148
(Continued)

FOREIGN PATENT DOCUMENTS

JP    2006-140489    6/2006
JP    2006-203098    8/2006
(Continued)

OTHER PUBLICATIONS

International Search Report issued Jun. 7, 2011 in corresponding International Application No. PCT/JP2011/001629.
(Continued)

*Primary Examiner* — Viet Q Nguyen
(74) *Attorney, Agent, or Firm* — Wenderoth, Lind & Ponack, L.L.P.

(57) ABSTRACT

Provided is a method for driving a non-volatile memory element in which a variable resistance element including a first electrode, a second electrode, and a variable resistance layer capable of reversibly changing between a high resistance state and a low resistance state with application of electrical signals having different polarities is connected in series with a current steering element having bidirectional rectifying characteristics with respect to an applied voltage. After the non-volatile memory element is manufactured, the resistance value of the variable resistance layer is reduced from a resistance value in the initial resistance state higher than that in the high resistance state by applying, to the non-volatile memory element, a voltage pulse having the polarity identical to that of the voltage pulse for changing the variable resistance layer from the low resistance state to the high resistance state in the normal operations.

14 Claims, 15 Drawing Sheets

(56) References Cited

U.S. PATENT DOCUMENTS

| | | | |
|---|---|---|---|
| 7,935,953 B2 * | 5/2011 | Ahn et al. ............................ 257/5 |
| 8,022,502 B2 * | 9/2011 | Kanzawa et al. ............. 257/529 |
| 8,054,674 B2 | 11/2011 | Tamai et al. |
| 8,058,636 B2 * | 11/2011 | Osano et al. ........................ 257/2 |
| 8,085,576 B2 * | 12/2011 | Hosono et al. ................. 365/148 |
| 8,085,577 B2 * | 12/2011 | Kanno et al. ................... 365/148 |
| 8,217,489 B2 | 7/2012 | Osano et al. |
| 8,237,146 B2 * | 8/2012 | Kreupl et al. ....................... 257/4 |
| 8,384,198 B2 * | 2/2013 | Yasutake ........................ 257/656 |
| 8,389,375 B2 * | 3/2013 | Maxwell ....................... 438/397 |
| 8,441,837 B2 * | 5/2013 | Ikeda et al. ................... 365/148 |
| 8,445,319 B2 * | 5/2013 | Kanzawa et al. ............. 438/104 |
| 2006/0098472 A1 | 5/2006 | Ahn et al. |
| 2007/0195581 A1 | 8/2007 | Morimoto |
| 2008/0121865 A1 | 5/2008 | Ahn et al. |
| 2009/0052225 A1 | 2/2009 | Morimoto |
| 2009/0250678 A1 | 10/2009 | Osano et al. |
| 2009/0283736 A1 | 11/2009 | Kanzawa et al. |
| 2010/0046273 A1 | 2/2010 | Azuma et al. |
| 2010/0172170 A1 | 7/2010 | Tamai et al. |
| 2011/0044088 A1 | 2/2011 | Muraoka et al. |
| 2011/0122680 A1 | 5/2011 | Ikeda et al. |
| 2011/0233510 A1 | 9/2011 | Kanzawa et al. |
| 2011/0294259 A1 | 12/2011 | Kanzawa et al. |
| 2012/0074369 A1 | 3/2012 | Osano et al. |

FOREIGN PATENT DOCUMENTS

| | | |
|---|---|---|
| JP | 2007-226883 | 9/2007 |
| JP | 2008-305889 | 12/2008 |
| JP | 2010-27753 | 2/2010 |
| WO | 2008/117371 | 10/2008 |
| WO | 2008/126365 | 10/2008 |
| WO | 2008/142919 | 11/2008 |
| WO | 2008/149484 | 12/2008 |
| WO | 2009/001534 | 12/2008 |
| WO | 2010/021134 | 2/2010 |
| WO | 2010/064410 | 6/2010 |
| WO | 2010/119671 | 10/2010 |

OTHER PUBLICATIONS

Reply to the Written Opinion issued Jun. 7, 2011 in corresponding International Application No. PCT/JP2011/001629 (with English translation).

* cited by examiner (a)

(b)

(a)

(b)

(a)

(b)

(a)

(b)

(a)

(b)

(c)

METHOD FOR DRIVING NON-VOLATILE MEMORY ELEMENT, AND NON-VOLATILE MEMORY DEVICE

TECHNICAL FIELD

The present invention relates to a method for driving a non-volatile memory element including a current steering element that has bidirectional rectifying characteristics with respect to an applied voltage, and to a non-volatile memory device that performs the method.

BACKGROUND ART

In recent years, the functionality of mobile digital electronic equipment, such as compact and thin digital AV players and digital cameras, has increased. High-speed non-volatile memory devices with greater capacity used as storage devices for such equipment are in increasing demand. In response to such a demand, much attention has been placed on non-volatile memory devices using ferroelectric capacitors and variable resistance elements that are kinds of non-volatile memory devices.

The variable resistance elements have two types: an only-once-writable type and a rewritable type. Furthermore, the rewritable variable resistance elements have two types. One type is variable resistance elements having characteristics that can reversibly change from a high resistance state to a low resistance state or from the low resistance state to the high resistance state, with application of two driving voltages of a same polarity. The variable resistance elements are generally called unipolar (or monopolar) variable resistance elements. The other type is variable resistance elements having characteristics that can reversibly change from the high resistance state to the low resistance state or from the low resistance state to the high resistance state, with application of two driving voltages of different polarities. The variable resistance elements are generally called bipolar variable resistance elements.

In the non-volatile memory device in which variable resistance elements are arranged in an array, the variable resistance elements are generally connected to current steering elements, such as transistors and rectifiers, thus preventing write disturbance caused by a bypass current in the array and crosstalk between adjacent memory cells. This structure secures the memory operation.

The unipolar variable resistance elements can control resistance change with two different driving voltages of the same polarity. Thus, unidirectional diodes using the nonlinear voltage-current characteristics of only one voltage polarity can be used as diodes functioning as current steering elements of the unipolar variable resistance elements, thus simplifying the structure of the memory cells each including a variable resistance element and the current steering element. However, the unipolar variable resistance elements need electric pulses with long pulse widths for reset operations for setting the variable resistance elements to the high resistance state, and thus the operating speed is low.

In contrast, the bipolar variable resistance elements control resistance change with two driving voltages of different polarities. Thus, the bipolar variable resistance elements need bidirectional diodes using the nonlinear voltage-current characteristics of the two voltage polarities as diodes functioning as current steering elements. The bipolar variable resistance elements can perform the reset operations for setting the variable resistance elements to the high resistance state and set operations for setting the variable resistance elements to the low resistance state, with application of electric pulses with shorter pulse widths at a high speed.

So far, PTL 1 suggests a cross point non-volatile memory device including memory cells in which variable resistance elements are connected in series with the unidirectional diodes functioning as current steering elements, such as p-n junction diodes and Schottky diodes.

Furthermore, PTL 2 suggests a cross point non-volatile memory device including memory cells in which variable resistance elements are connected in series with the bidirectional diodes as current steering elements.

For example, a metal-insulator-metal (MIM) diode, a metal-semiconductor-metal (MSM) diode, and a varistor disclosed in PTL 2 are known as the bidirectional diodes.

FIG. 16 illustrates voltage-current characteristics of a generally-known bidirectional diode. Such voltage-current characteristics are seen in the bidirectional diodes, such as an MIM diode, an MSM diode, and a varistor.

The voltage-current characteristics of such a bidirectional diode can be substantially symmetric with respect to the polarity of an applied voltage by optimizing materials of electrodes and materials to be interposed between the electrodes. In other words, it is possible to achieve the characteristics in which change in a current for a positive applied voltage and change in a current for a negative applied voltage substantially have a point symmetry with respect to the origin 0.

Furthermore, as illustrated in FIG. 16, the electric resistance of the bidirectional diode is very high when an applied voltage is between the second critical voltage $V_{th2}$ and the first critical voltage $V_{th1}$ inclusive (range C in FIG. 16), and sharply decreases when the applied voltage exceeds the first critical voltage $V_{th1}$ or falls below the second critical voltage $V_{th2}$ (ranges A and B in FIG. 16).

Combining the bidirectional diodes having such voltage-current characteristics with bipolar memory elements, that is, using the bidirectional diodes as current steering elements results in a cross point non-volatile memory device using the bipolar variable resistance elements.

CITATION LIST

Patent Literature

[PTL 1] Japanese Unexamined Patent Application Publication No. 2006-140489
[PTL 2] Japanese Unexamined Patent Application Publication No. 2006-203098

SUMMARY OF INVENTION

Technical Problem

However, the reproducibility of electric characteristics (particularly initial resistance) and the reliability (durability) of operations of the conventional variable resistance elements are not practically sufficient. Thus, further improvement on the reproducibility of electric characteristics of the variable resistance elements and the reliability (durability) of the operations are desired. The inventors have suggested a favorable structure of a variable resistance element as a related invention to solve these problems. The variable resistance element with the structure suggested will be described in detail in the beginning of Embodiment 1.

Although the variable resistance element according to the related invention can improve the reproducibility of electric characteristics and the reliability of operations, it has been found that new problems occur in the initialization process of the variable resistance element.

Many variable resistance elements including the variable resistance element with the structure suggested have a resistance value (hereinafter referred to as "initial resistance") higher than a resistance range used in the normal resistance change operations, in an initial state in which no voltage pulse high enough to change a resistance state of a variable resistance layer is applied after the manufacturing processes including the heat process, and perform no normal resistance change operation as they are. Thus, conventionally, an initialization process has been performed as a process for initializing the variable resistance element, that is, a process for reducing the resistance value of the variable resistance element from the initial resistance value to the resistance range in which the normal resistance change operations can be performed. The initialization process is to form a filament (conductive path) in a part of a variable resistance layer in a high resistance state, and set the variable resistance element to a variable resistance state with oxidation or reduction of the filament portion.

The initialization process is performed with application of a voltage or a current that is greater than a drive voltage or a drive current to be applied to a variable resistance element for causing a normal resistance change operation.

In the cross point non-volatile memory device, with application of a voltage for initializing the variable resistance element to a memory cell, a divided voltage of a voltage corresponding to the resistance value of the variable resistance element and the bidirectional diode that are included in the memory cell is applied to the variable resistance element and the bidirectional diode.

An improved variable resistance element with the structure suggested has an initial resistance value much higher than that of the variable resistance element without such improvement, which will be described in detail later. Thus, a higher initialization voltage needs to be applied to the variable resistance element with the structure suggested, than that of the conventional variable resistance element so that a current with a necessary amount for initialization flows.

The fact indicates that the divided voltage of the initialization voltage to be applied exceeds a power rating of the bidirectional diode and the bidirectional diode is at increased risk of being destroyed in the variable resistance element with the structure suggested.

The present invention has been conceived to solve the problems, and has an object of (i) improving the reproducibility of electric characteristics and the reliability of operations of a variable resistance element, and when such variable resistance elements are included in the non-volatile memory elements (memory cells), together with current steering elements such as the bidirectional diodes, (ii) providing a technique for reducing the risk that the current steering elements may be destroyed in initializing the variable resistance elements.

Solution to Problem

In order to solve the problems, the driving method according to an aspect of the present invention is a method for driving a non-volatile memory element including (i) a non-volatile variable resistance element and (ii) a current steering element connected in series with the variable resistance element and having bidirectional rectifying characteristics with respect to an applied voltage, the variable resistance element including: a first electrode; a second electrode; and a variable resistance layer (i) disposed between and in contact with the first electrode and the second electrode, (ii) reversibly changing between a high resistance state and a low resistance state with application of electrical signals having different polarities between the first electrode and the second electrode, and (iii) capable of maintaining one of the high resistance state and the low resistance state in a non-volatile manner even after the application of the electrical signals is stopped, the variable resistance layer including stacked layers including: a first transition metal oxide layer comprising an oxygen-deficient transition metal oxide and in contact with the first electrode; and a second transition metal oxide layer in contact with the second electrode and comprising a transition metal oxide lower in oxygen deficiency than the oxygen-deficient transition metal oxide, the current steering element including: a third electrode; a fourth electrode; and a current steering layer disposed between and in contact with the third electrode and the fourth electrode, wherein with application of electrical signals having different polarities between the third electrode and the fourth electrode, (i) the current steering element is OFF when an absolute value of a voltage amplitude of the electrical signals is smaller than a predetermined threshold, and (ii) the current steering element is ON when the absolute value is larger than or equal to the predetermined threshold, and the current steering element has characteristics of being destroyed when a current larger than or equal to a predetermined current-steering-element breakdown current with a positive polarity flows between the third electrode and the fourth electrode, the method includes: changing a resistance value of the variable resistance layer from a first high resistance state to the low resistance state by applying, to the non-volatile memory element, a voltage pulse having a polarity with which the second electrode has a negative polarity with respect to the first electrode of the variable resistance element; changing the resistance value of the variable resistance layer from the low resistance state to the first high resistance state by applying, to the non-volatile memory element, a voltage pulse having a polarity with which the second electrode has a positive polarity with respect to the first electrode; and reducing, after the non-volatile memory element is manufactured, a resistance value of the variable resistance element from an initial resistance value to a resistance value in a second high resistance state with application of a predetermined variable-resistance-element initialization current with a positive polarity by applying, to the non-volatile memory element, a voltage pulse having the polarity with which the second electrode has the positive polarity with respect to the first electrode, the initial resistance value being higher than a resistance value in the first high resistance state, the resistance value in the second high resistance state being lower than the initial resistance value, and the predetermined variable-resistance-element initialization current being smaller than the predetermined current-steering-element breakdown current.

Since in such a method, the initialization process is performed with the voltage pulse having the polarity identical to that of the voltage pulse for use in the erasing process, reduction in the resistance value of the variable resistance element starts from the initial resistance value and ends in the first high resistance state. Accordingly, it is possible to eliminate the possibility that the current steering element may be destroyed by (i) immediate decrease of the resistance value of the variable resistance element to the low resistance state in the initialization process, with application of a voltage pulse having the polarity identical to that of the voltage pulse for use in the writing process and (ii) flow of the predetermined variable-resistance-element initialization current larger than or equal to the predetermined current-steering-element breakdown current, through the current steering element.

Furthermore, in the reducing, after the voltage pulse having the polarity with which the second electrode has the positive polarity with respect to the first electrode is applied to the non-volatile memory element, the variable resistance element may be maintained in the second high resistance state having the resistance value higher than or equal to the resistance value in the first high resistance state to suppress a current that flows through the non-volatile memory element.

In this method, the resistance value of the variable resistance element is reduced from the initial resistance value to a resistance value in the second high resistance state while controlling the current that flows through the non-volatile memory element using the variable resistance element that is maintained to have a resistance value larger than or equal to a resistance value in the first high resistance state. Thus, the divided voltage of the voltage pulse to the current steering element and the current that flows through the current steering element can be suppressed smaller than that when the initialization process is performed using the voltage pulse having the polarity identical to that of the voltage pulse for use in the writing process. As a result, it is possible to reduce the risk that the current steering element may be destroyed.

In the non-volatile memory element on which the method according to the present invention is performed, an interface between the second transition metal oxide layer and the second electrode may be substantially flat.

Since the second electrode of the non-volatile memory element has no hillocks or protrusion and depression similar to the hillocks that negatively impact the reproducibility of electric characteristics and the reliability of operations of the non-volatile memory element, the reproducibility and the reliability can be improved.

Conversely, since the initial resistance of the variable resistance element increases, it is necessary to use a higher voltage pulse having a larger absolute value in the initialization process. However, the initialization process is performed with application of a voltage pulse having the polarity identical to that of the voltage pulse for use in the erasing process. Thus, it is possible to control reduction in the resistance value of the variable resistance element in the initialization process, prevent the excessive reduction, and reduce the risk that the current steering element may be destroyed.

Furthermore, the second electrode included in the variable resistance element may have a thickness smaller than or equal to a predetermined upper limit, according to a material comprised in the second electrode, the upper limit being determined in advance based on a relationship between an initial resistance and a thickness of an electrode comprising the material and included in a variable resistance element.

Preferably, an upper limit of a range of thicknesses in which the thicknesses are smaller and the initial resistance values are higher is identified for the second electrode of the non-volatile memory element to which the aforementioned method is applied, based on a relationship between an initial resistance and a thickness of an electrode comprising a material identical to that of the second electrode and included in a variable resistance element, and the second electrode is formed with the thickness smaller than or equal to the upper limit.

Specifically, the second electrode may comprise iridium or platinum that has a thickness between 1 nm and 10 nm inclusive.

Since the second electrode has no hillocks or protrusion and depression similar to the hillocks that negatively impact the reproducibility of electric characteristics and the reliability of operations of the non-volatile memory element, the reproducibility and the reliability can be improved with such a structure.

Conversely, since the initial resistance value of the variable resistance element increases, it is necessary to use a higher voltage pulse having a larger absolute value in the initialization process. However, the initialization process is performed with application of a voltage pulse having the polarity identical to that of the voltage pulse for use in the erasing process. Thus, it is possible to control reduction in the resistance value of the variable resistance element in the initialization process, prevent the excessive reduction, and reduce the risk that the current steering element may be destroyed.

Furthermore, the first transition metal oxide layer may comprise a tantalum oxide having a composition expressed as $TaO_x$, where $0.8 \leq x \leq 1.9$, and the second transition metal oxide layer may comprise a tantalum oxide having a composition expressed as $TaO_y$, where $y \geq 2.1$.

The variable resistance element with such a structure performs favorable resistance change operations.

Furthermore, the current steering element may be a bidirectional diode in which the current steering layer is interposed between electrodes that form a Schottky barrier junction with the current steering layer, the current steering layer comprising a silicon nitride having a composition expressed as $SiN_z$, where $0 < z \leq 0.85$.

The current steering element with such a structure has favorable bidirectional rectifying characteristics.

In order to solve the problems, the non-volatile memory device according to an aspect of the present invention is a non-volatile memory device including: a non-volatile memory element including (i) a non-volatile variable resistance element and (ii) a current steering element connected in series with the variable resistance element and having bidirectional rectifying characteristics with respect to an applied voltage; and a driving unit, the variable resistance element including: a first electrode; a second electrode; and a variable resistance layer (i) disposed between and in contact with the first electrode and the second electrode, (ii) reversibly changing between a high resistance state and a low resistance state with application of electrical signals having different polarities between the first electrode and the second electrode, and (iii) capable of maintaining one of the high resistance state and the low resistance state in a non-volatile manner even after the application of the electrical signals is stopped, the variable resistance layer including stacked layers including: a first transition metal oxide layer comprising an oxygen-deficient transition metal oxide and in contact with the first electrode; and a second transition metal oxide layer in contact with the second electrode and comprising a transition metal oxide lower in oxygen deficiency than the oxygen-deficient transition metal oxide, the current steering element including: a third electrode; a fourth electrode; and a current steering layer disposed between and in contact with the third electrode and the fourth electrode, wherein with application of electrical signals having different polarities between the third electrode and the fourth electrode, (i) the current steering element is OFF when an absolute value of a voltage amplitude of the electrical signals is smaller than a predetermined threshold, and (ii) the current steering element is ON when the absolute value is larger than or equal to the predetermined threshold, and the current steering element has characteristics of being destroyed when a current larger than or equal to a predetermined current-steering-element breakdown current with a positive polarity flows between the third electrode and the fourth electrode, the driving unit is configured to: change a resistance value of the variable resistance layer from a first high resistance state to the low resistance state by applying, to the non-volatile memory element, a voltage pulse having a polarity with which the second electrode has a negative polarity with respect to the first electrode of the variable resistance element; change the resistance value of the variable resistance layer from the low resistance state to the first high resistance state by applying, to the non-volatile memory element, a voltage pulse having a polarity with which the second electrode has a positive polarity with respect to the first electrode; and reduce, after the non-volatile memory element is manufactured, a resistance value of the variable resistance element from an initial resistance value to a resistance value in a second high resistance state with application of a predetermined variable-resistance-element initialization current with a positive polarity by applying, to the non-volatile memory element, a voltage pulse having the polarity with which the second electrode has the positive polarity with respect to the first electrode, the initial resistance value being higher than a resistance value in the first high resistance state, the resistance value in the second high resistance state being lower than the initial resistance value, and the predetermined variable-resistance-element initialization current being smaller than the predetermined current-steering-element breakdown current.

Since the driving unit reduces the resistance value of the variable resistance element with the voltage pulse having the polarity identical to that of the voltage pulse for use in the erasing process with this configuration, reduction in the resistance value of the variable resistance element starts from the initial resistance value and ends in the first high resistance state. Accordingly, it is possible to eliminate the possibility that the current steering element may be destroyed by (i) immediate decrease of the resistance value of the variable resistance element to the low resistance state in the initialization process, with application of a voltage pulse having the polarity identical to that of the voltage pulse for use in the writing process and (ii) flow of the predetermined variable-resistance-element initialization current larger than or equal to the predetermined current-steering-element breakdown current, through the current steering element.

Furthermore, after the voltage pulse having the polarity with which the second electrode has the positive polarity with respect to the first electrode is applied to the non-volatile memory element, when the driving unit reduces the resistance value of the variable resistance element, the variable resistance element may be maintained to have a resistance value larger than or equal to the resistance value in the first high resistance state to suppress a current that flows through the non-volatile memory element.

With this configuration, the driving unit reduces the resistance value of the variable resistance element from the initial resistance value to a resistance value in the second high resistance state while controlling the current that flows through the non-volatile memory element using the variable resistance element that is maintained to have a resistance value larger than or equal to a resistance value in the first high resistance state. Thus, the divided voltage of the voltage pulse to the current steering element and the current that flows through the current steering element can be suppressed smaller than those when the initialization process is performed using the voltage pulse having the polarity identical to that of the voltage pulse for use in the writing process. As a result, it is possible to reduce the risk that the current steering element may be destroyed.

Furthermore, an interface between the second transition metal oxide layer and the second electrode may be substantially flat.

Since the second electrode of the non-volatile memory element has no hillocks or protrusion and depression similar to the hillocks that negatively impact the reproducibility of electric characteristics and the reliability of operations of the non-volatile memory element, the reproducibility and the reliability can be improved.

Conversely, since the initial resistance of the variable resistance element increases, it is necessary to use a higher voltage pulse having a larger absolute value in the initialization process. However, the initialization process is performed with application of a voltage pulse having the polarity identical to that of the voltage pulse for use in the erasing process. Thus, it is possible to control reduction in the resistance value of the variable resistance element in the initialization process, prevent the excessive reduction, and reduce the risk that the current steering element may be destroyed.

Furthermore, the second electrode included in the variable resistance element may have a thickness smaller than or equal to a predetermined upper limit, according to a material comprised in the second electrode, the upper limit being determined in advance based on a relationship between an initial resistance and a thickness of an electrode comprising the material and included in a variable resistance element.

Preferably, an upper limit of a range of thicknesses in which the thicknesses are smaller and the initial resistance values are higher is identified for the second electrode of the non-volatile memory element to which the aforementioned method is applied, based on a relationship between an initial resistance and a thickness of an electrode comprising a material identical to that of the second electrode and included in a variable resistance element, and the second electrode is formed with the thickness smaller than or equal to the upper limit.

Specifically, the second electrode may comprise iridium or platinum that has a thickness between 1 nm and 10 nm inclusive.

Since the second electrode has no hillocks or protrusion and depression similar to the hillocks that negatively impact the reproducibility of electric characteristics and the reliability of operations of the non-volatile memory element, the reproducibility and the reliability can be improved with such a structure.

Conversely, since the initial resistance value of the variable resistance element increases, it is necessary to use a higher voltage pulse having a larger absolute value in the initialization process. However, the initialization process is performed with application of a voltage pulse having the polarity identical to that of the voltage pulse for use in the erasing process. Thus, it is possible to control reduction in the resistance value of the variable resistance element in the initialization process, prevent the excessive reduction, and reduce the risk that the current steering element may be destroyed.

Furthermore, the first transition metal oxide layer may comprise a tantalum oxide having a composition expressed as $TaO_x$, where $0.8 \leq x \leq 1.9$, and the second transition metal oxide layer may comprise a tantalum oxide having a composition expressed as $TaO_y$, where $y \geq 2.1$.

The variable resistance element with such a structure performs favorable resistance change operations.

Furthermore, the current steering element may be a bidirectional diode in which the current steering layer is interposed between electrodes that form a Schottky barrier junction with the current steering layer, the current steering layer comprising a silicon nitride having a composition expressed as $SiN_z$, where $0 < z \leq 0.85$.

The current steering element with such a structure has favorable bidirectional rectifying characteristics.

Advantageous Effects of Invention

The driving method according to the present invention is a method for driving a non-volatile memory element in which a variable resistance element capable of reversibly changing between a high resistance state and a low resistance state with application of electrical signals having different polarities is connected in series with a current steering element having bidirectional rectifying characteristics and characteristics of being destroyed when a current larger than or equal to a predetermined current-steering-element breakdown current with a positive polarity flows. The method is characterized by performing the initialization process with a predetermined variable-resistance-element initialization current with a positive polarity that is smaller than the predetermined current-steering-element breakdown current by applying the voltage pulse having the polarity identical to that of the voltage pulse for use in the erasing process for changing the variable resistance element to the high resistance state in the normal operation.

Here, the initialization process is to reduce the resistance value of the variable resistance element from a high resistance value in the initial state to the resistance range used in the normal resistance change operation, after manufacturing the non-volatile memory element. The erasing process is to set the resistance value of the variable resistance element to the high resistance state in the normal resistance change operation. Since a voltage or a current greater than that causing the normal resistance change operation is applied to the non-volatile memory element in the initialization process, there is a risk that the current steering element may be destroyed.

Since in the driving method, the initialization process is performed with the voltage pulse having the polarity identical to that of the voltage pulse for use in the erasing process, reduction in the resistance value of the variable resistance element starts from the high resistance value in the initial state and ends in a resistance value in the high resistance state in the normal resistance change operation. Thus, it is possible to eliminate the possibility that the resistance value of the variable resistance element immediately decreases to a resistance value in the low resistance state in the normal resistance change operation, when the initialization process is performed with a voltage pulse having a reversed polarity.

In other words, the driving method can control reduction in the resistance value of the variable resistance element in the initialization process and prevent the excessive reduction, thus reducing the risk that the current steering element may be destroyed.

Furthermore, in the non-volatile memory element to which the driving method according to the present invention is applied, an interface between the variable resistance layer and the second electrode may be substantially flat. Such a variable resistance element in a non-volatile memory element has a very high resistance value in the initial state, though the reproducibility of electric characteristics and the reliability of operations are superior. Since a higher voltage needs to be applied to the non-volatile memory element in the initialization process, the current steering element is at increased risk of being destroyed.

Thus, according to the driving method of the present invention, the voltage pulse having the polarity identical to that of the voltage pulse for changing the variable resistance element to the high resistance state is applied to the variable resistance element in the initialization process.

In the initialization process, the resistance value of the variable resistance element is reduced from the initial resistance value while controlling the current that flows through the non-volatile memory element using the variable resistance element that is maintained to have a resistance value larger than or equal to that of the high resistance state. Thus, the divided voltage of the voltage pulse to the current steering element and the current that flows through the current steering element can be suppressed smaller than that when the initialization process is performed using the voltage pulse having the reversed polarity.

As a result, it is possible to produce synergetic effect that brings the reproducibility of the electric characteristics and the reliability of operations that are superior advantages of the non-volatile memory element in which an interface between the second electrode and the variable resistance layer is substantially flat, and that reduces the risk that the current steering element may be destroyed in a state where a higher voltage has to be applied in the initialization process for the very high initial resistance value that is a disadvantage.

DESCRIPTION OF EMBODIMENTS

A method for driving a non-volatile memory element and a non-volatile memory device according to Embodiments of the present invention will be hereinafter described.

First, the non-volatile memory element to which the driving method according to the present invention is applied will be described, and then, the driving method and the non-volatile memory device according to Embodiments of the present invention will be described.

1. Basic Data of the Present Invention

The structure and advantages of the variable resistance element used in the non-volatile memory device according to the present invention will be described as the basic data of the present invention.

The variable resistance element includes (i) a variable resistance layer comprising an oxygen-deficient transition metal oxide and (ii) two electrodes that interpose the variable resistance layer, and one of the two electrodes is a thin film comprising platinum (Pt). The variable resistance layer may include two transition metal oxide layers having different oxygen deficiencies.

The inventors have verified that the variable resistance element having such a structure can improve the reproducibility of electric characteristics and the reliability of operations, and have filed a patent application as a related invention of the present invention. The structure and advantages of the related invention are described, in detail, in International Publication WO 2010/064410.

The following cites the summary of the International Publication according to the related invention for description. The terms used in the original publication are appropriately changed for consistency with the present invention.

Furthermore, the inventors have verified that the variable resistance element including electrodes comprising iridium (Ir) instead of Pt thin films can improve the reproducibility of electric characteristics and the reliability of operations, in the additional experiments after filing the application of the related invention. The result of the experiments will be described below.

<1.1 Factors that Hampers Improvement in Characteristics of Variable Resistance Elements>

In order to study the reproducibility of electric characteristics and the reliability of operations of the variable resistance element, the inventors have manufactured the variable resistance elements under various conditions and have verified the characteristics.

Figure 1:
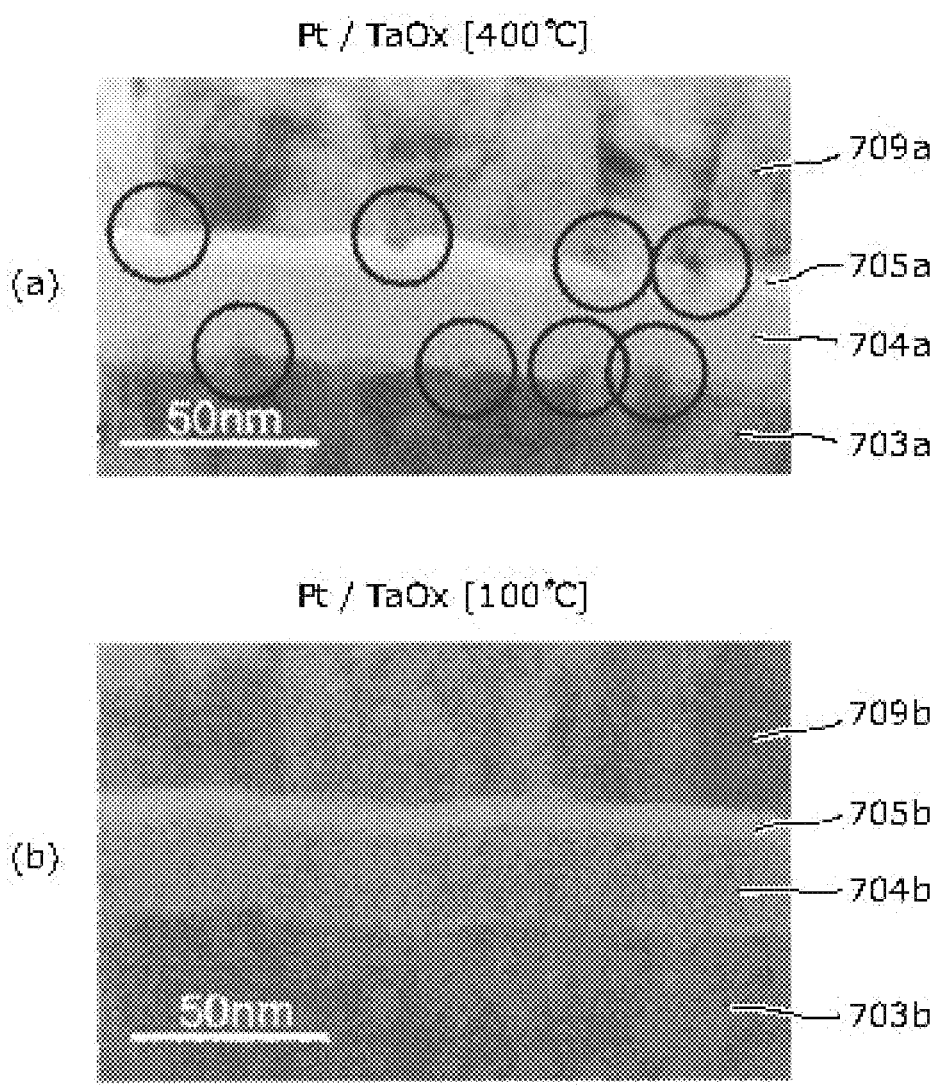
FIGS. 1 (*a*) and (*b*) illustrate transmission electron microscope (TEM) photos each indicating a cross section of a variable resistance element including a variable resistance layer comprising an oxygen-deficient tantalum oxide, as the basic data of the present invention.

FIGS. 1 (a) and (b) illustrate transmission electron microscope (TEM) photos each indicating a cross section of a variable resistance element including a variable resistance layer comprising a oxygen-deficient tantalum oxide. FIG. 1 (a) illustrates the element at the maximum temperature of 400° C. in the processes, and FIG. 1 (b) illustrates the element at the maximum temperature of 100° C. in the processes.

Here, the oxygen-deficient transition metal oxide is a transition metal oxide lower in atom ratio (hereinafter simply referred to as "oxygen content percentage") than a transition metal oxide having a stoichiometric composition. The atom ratio is a ratio of the number of oxygen atoms to the total number of atoms. For example, a tantalum oxide expressed as $Ta_2O_5$ having a stoichiometric composition contains oxygen atoms 2.5 times as much as tantalum atoms. A tantalum oxide smaller in oxygen content percentage than the tantalum oxide expressed as $Ta_2O_5$, that is, a tantalum oxide expressed as $TaO_x$ having a non-stoichiometric composition and satisfying $0<x<2.5$ is referred to as an oxygen-deficient tantalum oxide.

The element in FIG. 1 (a) was obtained by stacking, on a lower electrode 703a having a thickness of approximately 50 nm and comprising Pt, an oxygen-deficient first tantalum oxide layer 704a having a thickness of approximately 23 nm, a second tantalum oxide layer 705a having a thickness of approximately 8 nm, and an upper electrode 709a having a thickness of approximately 80 nm and comprising Pt in this order. The second tantalum oxide layer 705a was higher in oxygen content percentage than the first tantalum oxide layer 704a.

The element in FIG. 1 (a) was manufactured by the process technology used in manufacturing semiconductor devices. The maximum temperature of a heat process in the processes was approximately 400° C. The temperature 400° C. is a temperature of a sintering process that is a thermal process necessary for forming a metal interconnection by, for example, copper and aluminum.

The thickness of each of the layers was measured based on the TEM photos.

As is clear from the detailed study of FIG. 1 (a), when the element was heated at 400° C., hillocks comprising Pt (enclosed by circles in the photo) were formed from the lower electrode 703a to the first tantalum oxide layer 704a in the upper direction of the photo or from the upper electrode 709a to the second tantalum oxide layer 705a in the lower direction of the photo. Most of the hillocks were extended from the vicinity of grain boundaries of Pt comprised in the upper electrode 709a and the lower electrode 703a. It is particularly worthy of note that the hillocks extended from the upper electrode 709a reach approximately half the thickness of the second tantalum oxide layer 705a.

In contrast, although the method for manufacturing the element in FIG. 1 (b) was the same as that for the element in FIG. 1 (a), the maximum temperature of a heat process in the processes was suppressed approximately to 100° C. As illustrated in FIG. 1 (b), no hillock comprising Pt was formed from a lower electrode 703b to a first tantalum oxide layer 704b or from an upper electrode 709b to a second tantalum oxide layer 705b.

The initial resistances (resistance values between the upper electrode 709a and the lower electrode 703a and between the upper electrode 709b and the lower electrode 703b immediately after completion of the processes of manufacturing samples that include the heat process) were measured for each of the elements. The sample in FIG. 1 (a) (having the Pt hillocks) had a resistance approximately $10^2 \Omega$, and the sample in FIG. 1 (b) (having no Pt hillock) had a resistance approximately $10^8 \Omega$. In other words, the initial resistance of the element with the hillocks was lower by six orders of magnitude.

As described below, the second tantalum oxide layers 705a and 705b were provided to adjust the initial resistance of the variable resistance element, and play a very important role in performing stable resistance change operations on the variable resistance elements. When an electrode has the hillocks as in FIG. 1 (a), the electrode cannot obtain an initial resistance as designed. In other words, with the hillocks, the second tantalum oxide layer 705a is substantially thin, and the overall resistance value becomes lower than that without any hillock in the electrode.

Even when the hillocks occur in the electrode and the reproducibility of the hillocks is high, the resistance value can be designed in consideration of the hillocks. However, it is difficult to control the hillocks actually with high reproducibility of the occurrence density and the size. Thus, the occurrence of the hillocks causes decrease in the reproducibility of electric characteristics of the variable resistance element.

Furthermore, an electric field or a current was concentrated in the hillock portion, with application of a voltage between the upper electrode 709a and the lower electrode 703a in the state of FIG. 1 (a). With repetition of applying the voltage in such a state, there is a possibility that the first tantalum oxide layer 704a and the second tantalum oxide layer 705a are destroyed, the upper electrode 709a and the lower electrode 703a short out, and no resistance change occurs. In other words, the hillocks may cause decrease in the reliability (durability) of the variable resistance element.

As described above, it is expected that controlling of the hillocks occurring from the electrode to the oxygen-deficient tantalum oxide layer will improve the reproducibility of the electric characteristics of the element and the reliability of the operations.

The mechanism to form the hillocks is described as follows. In other words, change in the Pt layer in the heat process in the sample forming processes is one of the factors. When the Pt layer has a high temperature and Pt atoms migrate, it is possible that the hillocks occur. The hillocks grow from the grain boundaries of the Pt layer because the migration easily occurs along the grain boundaries of the Pt layer.

Furthermore, the inventors have verified that the same problem occurred even when hafnium (Hf) is used instead of tantalum (Ta) as a transition metal comprised in the variable resistance layer.

Figure 2:
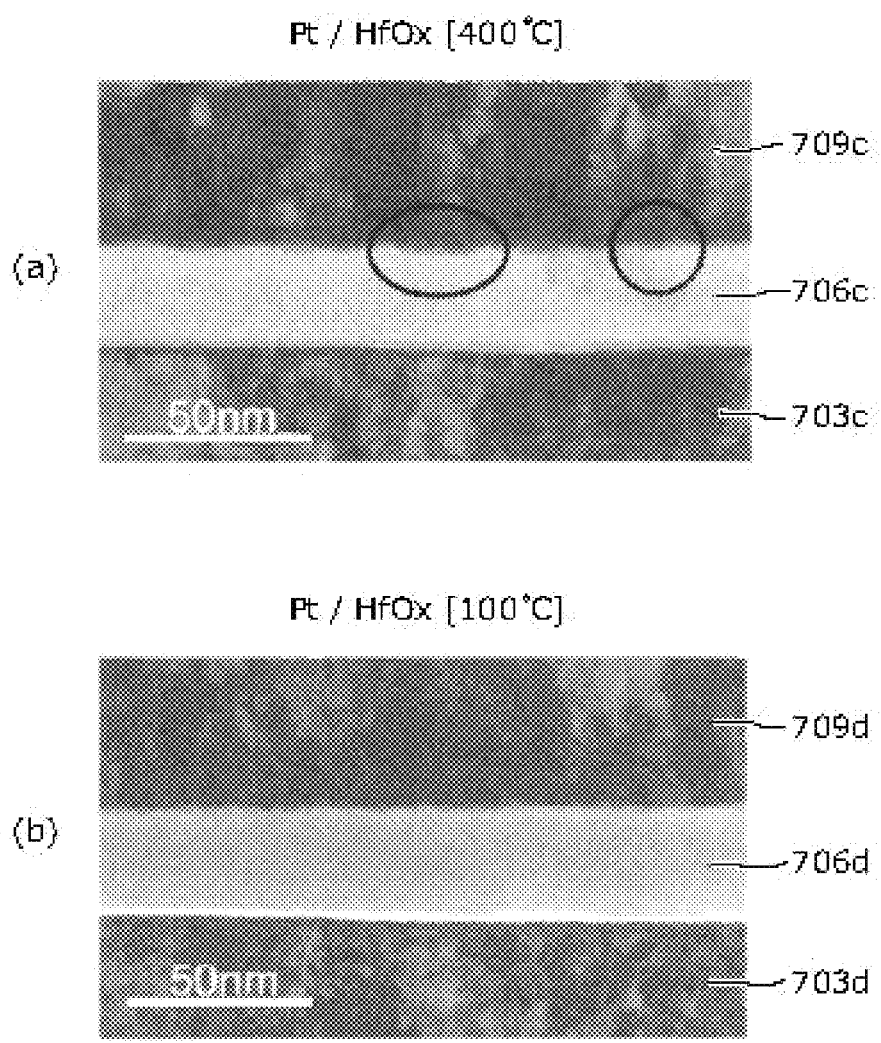
FIGS. 2 (*a*) and (*b*) illustrate TEM photos each indicating a cross section of a variable resistance element including a variable resistance layer comprising an oxygen-deficient hafnium oxide, as the basic data of the present invention.

FIGS. 2 (a) and (b) illustrate TEM photos each indicating a cross section of a variable resistance element including a variable resistance layer comprising a oxygen-deficient hafnium oxide. FIG. 2 (a) illustrates the element at the maximum temperature of 400° C. in the processes, and FIG. 2 (b) illustrates the element at the maximum temperature of 100° C. in the processes.

The element in FIG. 2 (a) was obtained by stacking, on a lower electrode 703c having a thickness of approximately 150 nm and comprising tungsten (W), an oxygen-deficient hafnium oxide layer 706c having a thickness of approximately 30 nm, and an upper electrode 709c having a thickness of approximately 75 nm and comprising Pt in this order. The element in FIG. 2 (a) was manufactured by the process technology used in manufacturing semiconductor devices. The maximum temperature of a heat process in the processes was approximately 400° C.

As is clear from the detailed study of FIG. 2 (a), when the element was heated at 400° C., wider hillocks (enclosed by a circle in the photo) comprising Pt were formed from the upper electrode 709c to the oxygen-deficient hafnium oxide layer 706c in the lower direction of the photo.

In contrast, the element in FIG. 2 (b) was obtained by stacking, on a lower electrode 703d having a thickness of approximately 150 nm and comprising W, an oxygen-deficient hafnium oxide layer 706d having a thickness of approximately 30 nm, and an upper electrode 709d having a thickness of approximately 75 nm and comprising Pt in this order. The maximum temperature of a heat process in the processes for the element in FIG. 2 (b) was suppressed approximately to 100° C. As illustrated in FIG. 2 (b), no hillock comprising Pt was formed in the upper electrode 709d of the element whose maximum temperature of the heat process in the processes was set approximately to 100° C.

The result shows that the hillocks comprising Pt are easily formed at a high temperature in the variable resistance element including, as constituent elements, a transition metal oxide layer and a thicker Pt layer functioning as an electrode, regardless of the kinds of the transition metals.

Although the electrode comprising only Pt is described in the above example, it is inferred that the similar hillocks are formed from a material mainly comprising Pt (an alloy material persistently having a Pt property). In other words, when platinum (Pt) is used as an electrode material of a variable resistance element, improvement in the reproducibility of electric characteristics (particularly, initial resistance) and the reliability (durability) of operations of the variable resistance element will have to be addressed.

Here, when the heating process is omitted in forming an element, it is expected that formation of hillocks can be controlled. However, the heating process at approximately several hundred degrees Celsius is indispensable in the general semiconductor processes. Furthermore, setting, approximately to 100° C., the upper limit of the heating temperature is not realistic in the processes for manufacturing the elements.

<1.2 Variable Resistance Element Including Electrode Using Pt Thin Film>

As a result of the additional study based on the related knowledge, the inventors have found that thinning an electrode comprising Pt can control occurrence of the hillocks. The result on the experiment for the verification will be hereinafter described.

Figure 3:
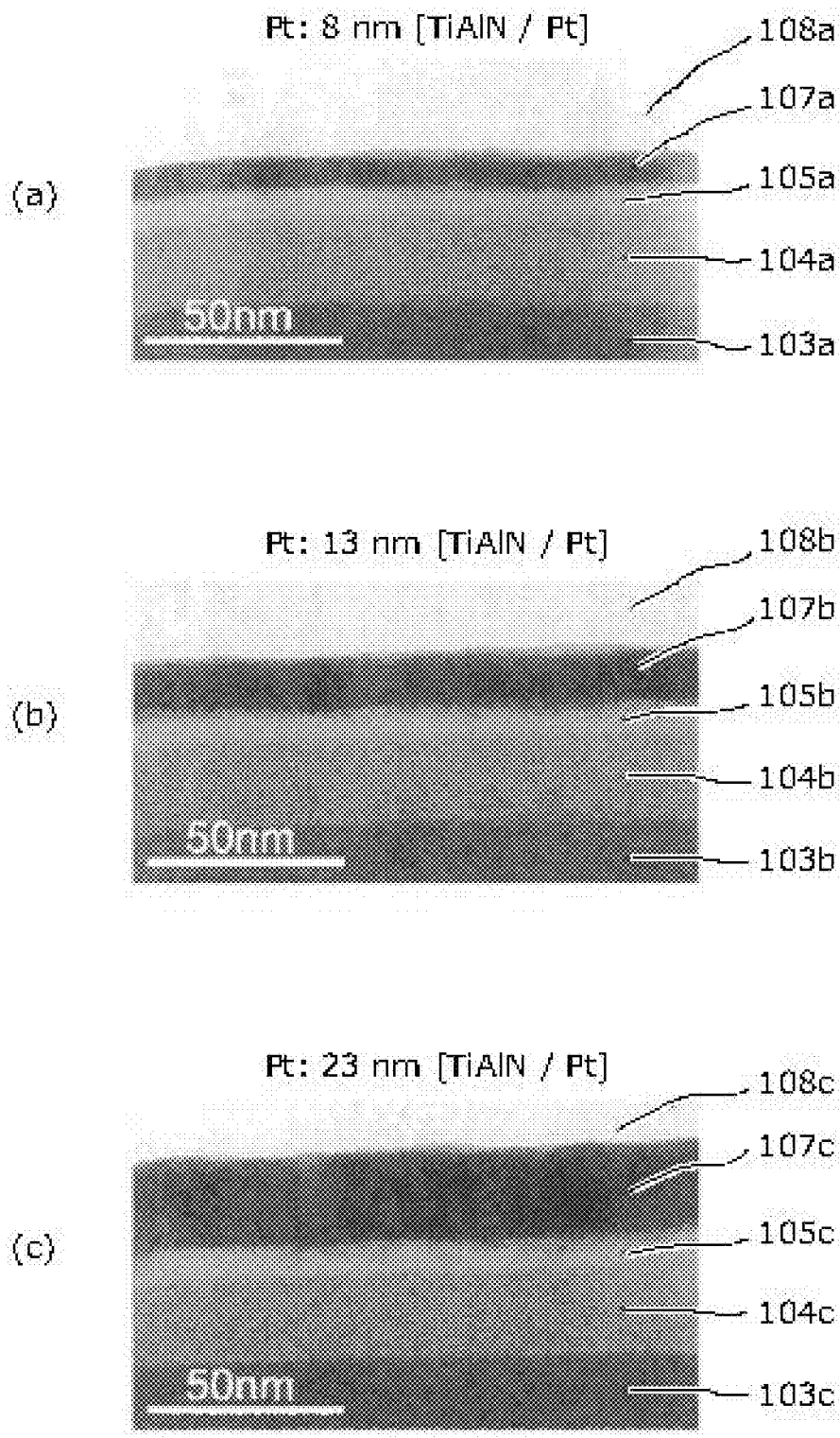
FIGS. 3 (*a*), (*b*), and (*c*) illustrate TEM photos each indicating a cross section of a variable resistance element including an electrode comprising platinum, as the basic data of the present invention.

FIGS. 3 (a), (b), and (c) illustrate TEM photos each indicating a cross section of a variable resistance element manufactured in the experiment. FIG. 3 (a) illustrates a cross section of a variable resistance element A, FIG. 3 (b) illustrates a cross section of a variable resistance element B, and FIG. 3 (c) illustrates a cross section of a variable resistance element C. The elements A, B, and C were formed by stacking, on respective substrates, lower electrodes 103a, 103b, and 103c comprising tantalum nitride (TaN), the first tantalum oxide layers 104a, 104b, and 104c, the second tantalum oxide layers 105a, 105b, and 105c, upper electrodes 107a, 107b, and 107c comprising Pt, and conductive layers 108a, 108b, and 108c comprising titanium aluminum nitride (TiAlN), respectively, in this order.

Except that the upper electrodes 107a, 107b, and 107c have thicknesses of 8 nm in the element A, 13 nm in the element B, and 23 nm in the element C, respectively, all the elements were manufactured in the same manufacturing processes and have the same structure. The processes for manufacturing such variable resistance element will be described using the element A as a representative.

First, thermal oxidation on a substrate comprising a single-crystal silicon produces a silicon oxide layer having a thickness of 200 nm on the substrate (not illustrated). The lower electrode 103a comprising TaN and having a thickness of 40 nm is formed on the silicon oxide layer by sputtering.

Then, an oxygen-deficient tantalum oxide layer having a thickness of 30 nm is formed on the obtained lower electrode 103a by sputtering. Here, a method for sputtering a Ta target in a mixed gas atmosphere of argon gas and oxygen gas can be used as the sputtering. More specifically, it is possible that vacuum (back pressure) in a sputtering apparatus is approximately $7\times10^{-4}$ Pa before sputtering, power is 250 W when sputtering, the total gas pressure of the argon gas and the oxygen gas is 3.3 Pa, the flow ratio of the oxygen gas is 3.8%, the preset temperature of the substrate is 30° C., and the time period for film formation is seven minutes.

The surface of the oxygen-deficient tantalum oxide layer is oxidized using a plasma oxidation apparatus, thus forming, from the homogeneous oxygen-deficient tantalum oxide layer, the first tantalum oxide layer 104a having a thickness of approximately 23 nm and the second tantalum oxide layer 105a having a thickness of approximately 8 nm.

The composition of the first tantalum oxide layer 104a formed in this manner is, for example, $TaO_{1.38}$ (oxygen content percentage is approximately 58 atm %). Furthermore, the composition of the second tantalum oxide layer 105a is, for example, $TaO_{2.47}$ (oxygen content percentage is approximately 71 atm %). Since the method for identifying the thickness and composition of each of the layers is described in the original document, the description herein is omitted.

After the oxidization process, a Pt layer is formed on the second tantalum oxide layer 105a as the upper electrode 107a by sputtering. The thickness of the Pt layer can range, for example, between 1 nm and 10 nm inclusive. The preferable thickness range of the Pt layer will be described later. After the formation of the upper electrode 107a, the conductive layer 108a comprising TiAlN and having a thickness of 80 nm is formed on the upper electrode 107a by sputtering. As described above, the element A is manufactured. The elements B and C are manufactured in the same manufacturing processes.

Here, each of the elements is heated at 400° C. for 10 minutes in the sintering process.

As clarified from the detailed study on FIGS. 3 (*a*), (*b*), and (*c*), no hillock occurred from the upper electrode 107a (Pt layer having a thickness of 8 nm) in the element A. The element B has protrusion and depression of approximately 2 nm in the upper electrode 107b (Pt layer having a thickness of 13 nm), thus showing growth of hillocks.

In the element C, hillocks reaching the center vicinity of the second tantalum oxide layer 105c from the upper electrode 107c (Pt layer having a thickness of 23 nm) are observed. However, the shape of the hillocks is unclear, compared with the example of the upper electrode 709a (Pt layer having a thickness of 80 nm) in FIG. 1 (*a*).

The result shows that occurrence of the hillocks is significantly suppressed by reducing the thickness of the Pt layer when the Pt layer is used as an electrode. Furthermore, as the Pt layer is thicker, the effect of suppressing the occurrence of the hillocks is more attenuated.

Furthermore, an experiment for studying a relationship between a thickness of an upper electrode (Pt layer) and the initial resistance of a variable resistance element was conducted. In addition to the elements A, B, and C used in the observation of the cross sections, an element O including an upper electrode having a much smaller thickness (5 nm) and an element X including an upper electrode having a much larger thickness (80 nm) were manufactured.

Figure 4:
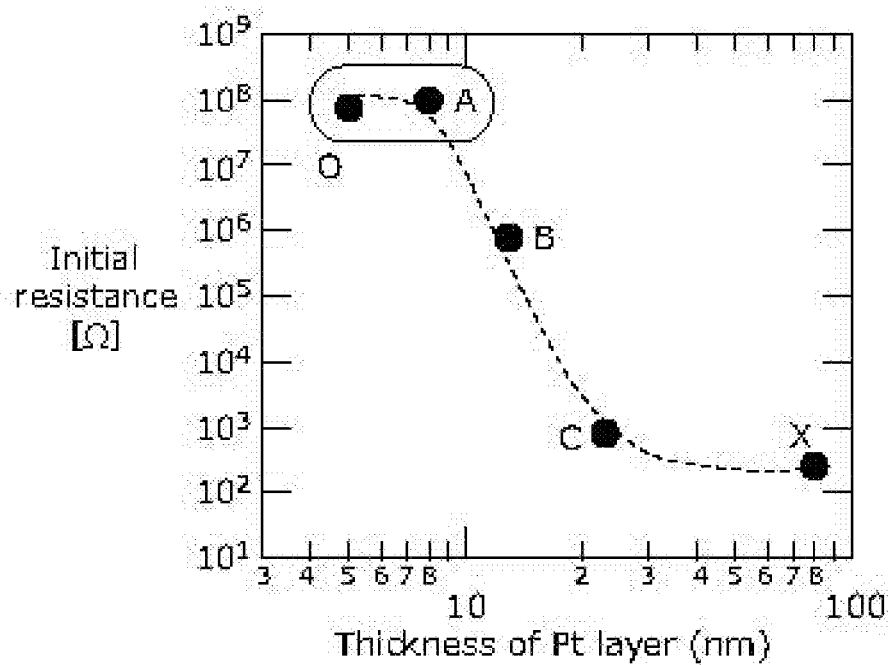
FIG. 4 is a graph representing a relationship between thicknesses of the electrode in the variable resistance element and the initial resistances of the variable resistance element, as the basic data of the present invention.

FIG. 4 is a graph plotting the initial resistances of the elements O, A, B, C, and X relative to the thicknesses of respective Pt layers.

Each of the initial resistances was measured by applying a very low voltage of 50 mV between the lower electrode and the upper electrode and measuring the flowing current.

As illustrated in FIG. 4, the initial resistances of the element O (Pt layer having a thickness of 5 nm) and the element A (Pt layer having a thickness of 8 nm) were as very high as approximately $10^8 \Omega$, showing almost the same resistance values as that of the element indicated in FIG. 1 (*b*) (element manufactured by suppressing the heat process in the processes approximately to 100° C.). However, the initial resistance of the element B (Pt layer having a thickness of 13 nm) decreased to $10^6 \Omega$, and the initial resistance of the element C (Pt layer having a thickness of 23 nm) further decreased to approximately $800 \Omega$. The initial resistance of the element X (Pt layer having a thickness of 80 nm) further decreased to approximately $300 \Omega$ that is approximately half the initial resistance of the element C.

The decrease in the resistance value according to increase in the thickness of the Pt layer as the upper electrode is probably strongly correlated with the hillocks in the Pt layer or formation of the protrusion and depression. In other words, as the Pt layer is thicker, the hillocks (protrusion and depression) of the Pt layer start to grow toward the second tantalum oxide layer, and part of the second tantalum oxide layer effectively becomes thinner.

The second tantalum oxide layer is higher in resistance than the first tantalum oxide layer. Thus, when the Pt hillocks enter the second tantalum oxide layer, the initial resistance of the variable resistance element is significantly reduced. Conversely, a higher initial resistance of the variable resistance element indicates greater suppression of occurrence of the Pt hillocks.

FIG. 4 shows that the initial resistance is maintained as high as approximately $10^8 \Omega$ when the thickness of the Pt layer is smaller than or equal to 10 nm (range enclosed by a circle) and the initial resistance starts to decrease when the thickness of the Pt layer exceeds 10 nm. The result shows that no Pt hillock that affects the initial resistance is formed in the Pt layer having the thickness smaller than or equal to 10 nm. In other words, an interface between the variable resistance layer and the Pt layer having the thickness smaller than or equal to 10 nm is substantially flat. In such a thin Pt layer, crystal grain would not grow enough to have grain boundaries resulting in formation of hillocks.

Thus, setting the thickness of a Pt layer smaller than or equal to 10 nm is preferable so as to suppress the occurrence of hillocks in the Pt layer and protrusion and depression similar to the hillocks and substantially flatten the Pt layer.

Furthermore, although the details are omitted herein, another experiment shows a result that the minimum necessary thickness of the Pt layer is 1 nm because Pt forms a continuous film. Thus, the favorable thickness of the Pt layer as an electrode probably ranges 1 nm and 10 nm inclusive.

<1.3 Variable Resistance Element Including Electrode Comprising Ir>

As a result of the additional study, the inventors have also found that use of an electrode comprising Ir can suppress the occurrence of hillocks. The experiment for the verification will be hereinafter described.

In the experiment, three types of variable resistance elements having respective Ir layers different in thickness, that is, an element D (including an Ir layer having a thickness of 30 nm), an element E (including an Ir layer having a thickness of 50 nm), and an element F (including an Ir layer having a thickness of 70 nm) were manufactured using the Ir layers as upper electrodes instead of the thin Pt layers.

Figure 5:
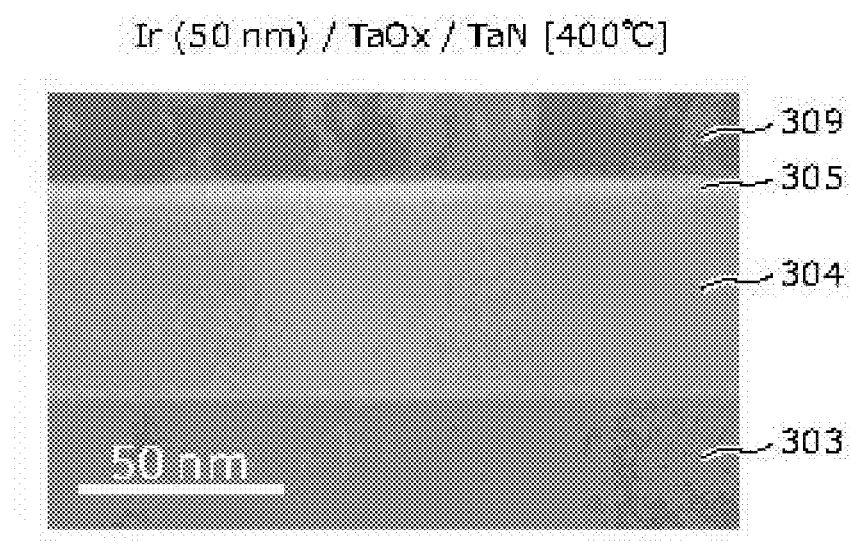
FIG. 5 illustrates a TEM photo indicating a cross section of a variable resistance element including an electrode comprising iridium, as the basic data of the present invention.

FIG. 5 illustrates a TEM photo indicating a cross section of the variable resistance element manufactured in this experiment, using the element E as a representative. The element E was obtained by stacking, on a substrate that is not illustrated, a lower electrode 303 comprising TaN, a first tantalum oxide layer 304, a second tantalum oxide layer 305, and an upper electrode 309 comprising Ir in this order. Each thickness and composition of the lower electrode 303, the first tantalum oxide layer 304, and the second tantalum oxide layer 305 are the same as those of the element A as described above.

The elements D and F have the same structure as the element E except that the thickness of each of the upper electrodes 309 thereof is different from that of the element E. Here, the conductive layers are omitted in the elements D, E, and F.

As clarified from the detailed study on FIG. 5, no hillock occurred from the upper electrode 309 (including the Ir layer having the thickness of 50 nm) in the element E. Furthermore, as a result of the similar observation on the cross sections, no hillock occurred from the respective upper electrodes in the element D (including the Ir layer having the thickness of 30 nm) and the element F (the Ir layer having the thickness of 70 nm).

Thus, it is clear that use of an Ir layer having a thickness larger than or equal to 70 nm as an electrode can suppress the occurrence of the hillocks.

Figure 6:
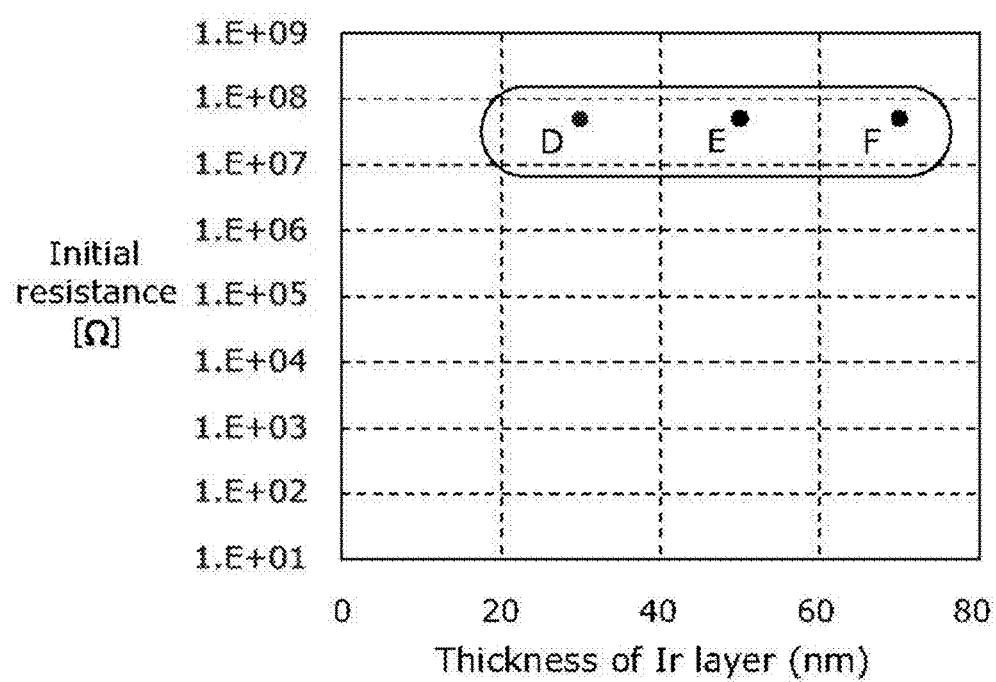
FIG. 6 is a graph representing a relationship between thicknesses of the electrode in the variable resistance element and the initial resistances of the variable resistance element, as the basic data of the present invention.

FIG. 6 is a graph plotting the initial resistances of the elements D, E, and F relative to the thicknesses of respective Ir layers.

As illustrated in FIG. 6, the initial resistance of each of the elements D, E, and F was as very high as approximately $10^8 \Omega$, showing almost the same resistance values as that of the element indicated in FIG. 1 (b) (element manufactured by suppressing the heat process in the processes approximately to 100° C.).

The result coincides with the observation of no hillocks in the cross section of the elements D, E, and F. Thus, using the Ir layer as an electrode of the variable resistance element can substantially flatten the interface between the electrode and the variable resistance layer.

<1.4 Summary of Basic Data>

As a summary of the basic data, the Description defines that an interface between an electrode and a variable resistance layer that are included in a variable resistance element is substantially flat when the thickness of the electrode is smaller than or equal to a predetermined upper limit, based on a relationship between an initial resistance and a thickness of the other electrode comprising the same material as that of the electrode.

Here, the upper limit is preferably within a range of thicknesses (for example, range enclosed by the circles in FIGS. 4 and 6) in which the initial resistance values are maintained higher and the thicknesses are maintained smaller, based on the relationship between the initial resistances and the thicknesses of the electrodes of the variable resistance elements. In other words, the upper limit is a limit of a thickness of electrodes with which the initial resistance starts to decrease as the electrode is thickened.

Although the upper limit of the thickness was 10 nm as the specific example when a Pt electrode was used (FIG. 4), the upper limit of the thickness has not been found from the thicknesses less than 70 nm when an Ir electrode was used (FIG. 6). It is practically difficult to form an Ir electrode thicker than 70 nm as an electrode. Thus, the upper limit of an Ir electrode is not particularly defined to flatten the interface between the electrode and the variable resistance layer.

As a summary, an electrode of a variable resistance element desirably comprises Ir or includes a Pt layer having a thickness larger than or equal to 10 nm. In such an electrode, no hillock that causes decrease in the initial resistance is formed, and the interface between the electrode and the variable resistance layer becomes flat. As a result, reproducibility of the electric characteristics and reliability of the operations of the variable resistance element can be improved.

<1.5 Problems in Variable Resistance Element with Above Structure>

The variable resistance element having the substantially flat interface between the electrode and the variable resistance layer has no hillock that causes decrease in the initial resistance of the electrode. Thus, the initial resistance was very high. Actually, the resistance value as high as approximately $10^8 \Omega$ was measured in the experiment.

As described in the beginning, a higher initial voltage needs to be applied to the variable resistance element having the higher initial resistance for the initialization. Thus, when a variable resistance element included in a non-volatile memory element (for example, a memory cell included in a cross point non-volatile memory device) in which the variable resistance element is connected in series with a current steering element (for example, a bidirectional diode) is initialized and a divided voltage of the initial voltage that is to be applied to the non-volatile memory element exceeds a rated voltage of the current steering element, the current steering element is at increased risk of being destroyed.

The inventors have found a favorable method for driving a non-volatile memory element and a non-volatile memory device that performs such a driving method, after a great deal of study on measurements for reducing such risk. A method for driving a non-volatile memory element and a non-volatile memory device according to the present invention will be hereinafter described.

2. Embodiment 1

A method for driving a non-volatile memory element according to Embodiment 1 of the present invention will be described in detail with reference to drawings.

The driving method is a method for driving a non-volatile memory element in which a current steering element is connected in series with a variable resistance element having a substantially flat interface between an electrode and a variable resistance layer and having no hillock in the electrode. The method is characterized by reducing a resistance value of the variable resistance element from an initial resistance value higher than a resistance value in a first high resistance state to a second high resistance state lower than the initial resistance value, by applying, in an initialization process, a voltage pulse having the polarity identical to that of a voltage pulse applied, in a normal operation, to the non-volatile memory element for changing from the low resistance state to the first high resistance state.

<2.1 Structure of Nonvolatile Memory Element>

First, the structure of a non-volatile memory element driven by a driving method according to Embodiment 1 will be described.

Figure 7:
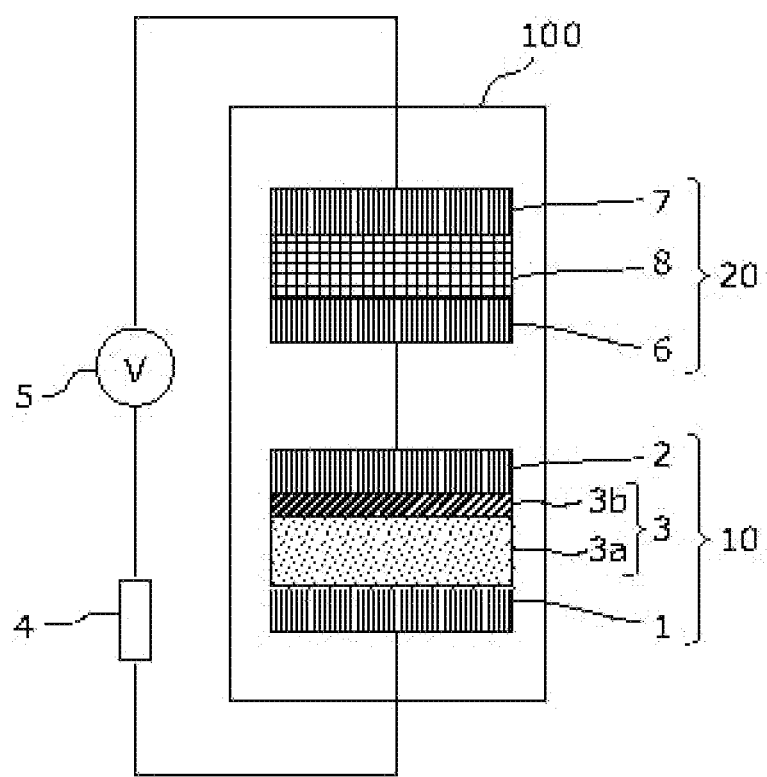
FIG. 7 schematically illustrates an example of a structure of a non-volatile memory element driven by a driving method according to Embodiment 1.

FIG. 7 schematically illustrates an example of a structure of a non-volatile memory element 100 driven by a driving method according to Embodiment 1. As illustrated in FIG. 7, the non-volatile memory element 100 includes a variable resistance element 10 and a current steering element 20 that are formed on a substrate that is not illustrated.

The variable resistance element 10 includes a first electrode 1, a second electrode 2, and a variable resistance layer 3 disposed between the first electrode 1 and the second electrode 2, and the current steering element 20 includes a third electrode 6, a fourth electrode 7, and a semiconductor layer 8 disposed between the third electrode 6 and the fourth electrode 7. Furthermore, the variable resistance element 10 is electrically connected in series with the current steering element 20.

In the variable resistance element 10, the first electrode 1 comprises one or more materials of, for example, copper (Cu), TaN, Ta, titanium (Ti), and titanium nitride (TiN).

The second electrode 2 comprises Ir or Pt having a thickness between 1 nm and 10 nm inclusive. As described in detail using the basic data of the present invention, with the structure, no hillock is formed in the second electrode 2 toward the variable resistance layer 3, and the interface between the second electrode 2 and the variable resistance layer 3 is substantially flat.

The variable resistance layer 3 has a stacked structure of an oxygen-deficient first transition metal oxide layer 3a and a second transition metal oxide layer 3b that are in contact with each other. The second transition metal oxide layer 3b is in contact with the second electrode 2 and the first transition metal oxide layer 3a.

The second transition metal oxide layer 3b is higher in oxygen content percentage than the first transition metal oxide layer 3a. In other words, the second transition metal oxide layer 3b is lower in oxygen deficiency than the first transition metal oxide layer 3a.

In the Description, the oxygen deficiency of a transition metal oxide defines a ratio of deficient oxygen in a transition metal oxide relative to the amount of oxygen included in the oxide having its stoichiometric composition. For example, when a transition metal is tantalum, the stoichiometric composition of the oxide is $Ta_2O_5$, which can be expressed as $TaO_{2.5}$. For example, the oxygen deficiency of $TaO_{2.5}$ is 0% while the oxygen deficiency of an oxygen-deficient tantalum oxide with the composition of $TaO_{1.5}$ is determined by the expression; the oxygen deficiency=(2.5−1.5)/2.5=40%.

A metal comprised in the variable resistance layer 3 may be a transition metal other than tantalum. The transition metals include tantalum (Ta), titanium (Ti), hafnium (Hf), zirconium (Zr), niobium (Nb), and tungsten (W). Since the transition metal can take a plurality of oxidation states, this can provide different resistance states by an oxidation-reduction reaction.

When (i) an oxygen-deficient tantalum oxide layer is used as the variable resistance layer 3, (ii) the composition of the first transition metal oxide layer 3a is expressed as $TaO_x$ ($0.8 \leq x \leq 1.9$), and (iii) the composition of the second transition metal oxide layer 3b is expressed as $TaO_y$ ($y \geq 2.1$), the stable and high-speed change in the resistance value of the variable resistance layer 3 has been verified. It is preferred that the second transition metal oxide layer 3b having the composition of $TaO_y$ has a thickness between 1 nm and 8 nm inclusive.

When (i) an oxygen-deficient hafnium oxide layer is used as the variable resistance layer 3, (ii) the composition of the first transition metal oxide layer 3a is expressed as $HfO_x$ ($0.9 \leq x \leq 1.6$), and (iii) the composition of the second transition metal oxide layer 3b is expressed as $HfO_y$ ($y > 1.8$), the stable and high-speed change in the resistance value of the variable resistance layer 3 has been verified. It is preferred that the second transition metal oxide layer 3b having the composition of $HfO_y$ has a thickness between 3 nm and 4 nm inclusive.

When (i) an oxygen-deficient zirconium oxide layer is used as the variable resistance layer 3, (ii) the composition of the first transition metal oxide layer 3a is expressed as $ZrO_x$ ($0.9 \leq x \leq 1.4$), and (iii) the composition of the second transition metal oxide layer 3b is expressed as $ZrO_y$ ($y > 1.9$), the stable and high-speed change in the resistance value of the variable resistance layer 3 has been verified. It is preferred that the second transition metal oxide layer 3b having the composition of $ZrO_y$ has a thickness between 1 nm and 5 nm inclusive.

The variable resistance layer 3 can contain other elements intentionally in small amounts for fine adjustments of the resistance value, etc. Furthermore, when the variable resistance layer 3 is formed, there are cases where other elements enter the variable resistance layer 3 in minute amounts without intention, due to residual gas in the apparatus and gas emission from a chamber wall. In such a case, the variable resistance layer 3 has only to include a transition metal oxide layer comprising, such as tantalum, hafnium, and zirconium, as main metal oxides.

The variable resistance layer 3 has only to have a thickness smaller than or equal to 1 μm, and preferably smaller than or equal to 200 nm. This structure facilitates fabrication when lithography is used as a patterning process. Furthermore, the structure can reduce the voltage value of a voltage pulse necessary for changing the resistance value of the variable resistance layer 3. In addition, the variable resistance layer 3 has only to have a thickness larger than or equal to 5 nm.

Here, the first transition metal comprised in the first transition metal oxide layer 3a may be different from the second transition metal comprised in the second transition metal oxide layer 3b. It is preferred that the second transition metal oxide layer 3b is lower in oxygen deficiency than the first transition metal oxide layer 3a, that is, higher in resistance than the first transition metal oxide layer 3a.

With the structure, the voltage applied between the first electrode 1 and the second electrode 2 is distributed more to the second transition metal oxide layer 3b. As a result, an oxidation-reduction reaction in the second transition metal oxide layer 3b can easily occur.

Furthermore, when different materials are used as the first transition metal and the second transition metal, it is preferred that the second transition metal is lower in standard electrode potential than the first transition metal. This is because an oxidation-reduction reaction in a tiny filament (conductive path) formed in the second transition metal oxide layer 3b having a high resistance value changes the resistance value, which presumably results in the resistance change phenomenon.

For example, a stable resistance change operation is achieved when the first transition metal oxide layer 3a comprises an oxygen-deficient tantalum oxide while the second transition metal oxide layer 3b comprises a titanium oxide ($TiO_2$). Titanium (with the standard electrode potential=−1.63 eV) is a material lower in standard electrode potential than tantalum (with the standard electrode potential=−0.6 eV).

The standard electrode potential having a larger value represents a property of being more difficult to oxidize. Providing, as the second transition metal oxide layer 3b, a metal oxide lower in standard electrode potential than the first transition metal oxide layer 3a makes an oxidation-reduction reaction more likely to occur in the second transition metal oxide layer 3b.

The oxidation-reduction reaction in a tiny filament formed in the second transition metal oxide layer 3b having a high resistance value changes the resistance value. As such, the resistance change phenomenon occurs in the variable resistance layer in the stacked structure of the materials.

Specifically, when a positive voltage is applied, with respect to the first electrode 1, to the second electrode 2 closer to the second transition metal oxide layer 3b, oxygen ions in the variable resistance layer 3 are attracted toward the second transition metal oxide layer 3b. This causes an oxidation reaction in the tiny filament formed in the second transition metal oxide layer 3b, which presumably increases the resistance of the tiny filament.

Conversely, when a negative voltage is applied, with respect to the first electrode 1, to the second electrode 2 closer to the second transition metal oxide layer 3b, oxygen ions in the second transition metal oxide layer 3b are forced toward the first transition metal oxide layer 3a. This causes a reduction reaction in the tiny filament formed in the second transition metal oxide layer 3b, which presumably decreases the resistance of the tiny filament.

The first electrode 1 connected to the second transition metal oxide layer 3b having a lower oxygen deficiency comprises a material, for example, platinum (Pt) and iridium (Ir), higher in standard electrode potential than a transition metal included in the second transition metal oxide layer 3b and a material of the first electrode 1. The above structure allows an oxidation-reduction reaction to selectively occur in the second transition metal oxide layer 3b near the interface between the second electrode 2 and the second transition metal oxide layer 3b, which provides a stable resistance change phenomenon.

It is preferred to use a silicon nitride in the semiconductor layer 8 of the current steering element 20 and the composition is $SiN_z$ ($0<z\leq0.85$). Furthermore, the semiconductor layer 8 preferably has a thickness larger than or equal to 5 nm.

Furthermore, the third electrode 6 and the fourth electrode 7 may comprise a metal, such as aluminum (Al), Cu, Ti, W, Pt, Ir, chromium (Cr), nickel (Ni), and niobium (Nb), and a mixture (alloy) of these metals. Alternatively, the third electrode 6 and the fourth electrode 7 may comprise a conductive compound, such as TiN, titanium tungsten (TiW), TaN, titanium silicide ($TaSi_2$), tantalum nitride silicide (TaSiN), TiAlN, niobium nitride (NbN), tungsten nitride (WN), tungsten silicide ($WSi_2$), tungsten nitride silicide (WSiN), rethenium oxide ($RuO_2$), indium oxide ($In_2O_3$), tin oxide ($SnO_2$), and $IrO_2$ (iridium oxide), or a mixture of the conductive compounds.

Here, the material comprised in the third electrode 6 and the fourth electrode 7 are not limited to these materials. As long as the materials implement rectification with potential barriers formed with the semiconductor layer 8, the materials may be any.

The variable resistance element 10 and the current steering element 20 are connected in series with each other, and form the non-volatile memory element 100.

The non-volatile memory element 100 is connected to an external measurement system for measuring the electric characteristics of the non-volatile memory element 100. A load resistor 4 and a power source 5 are equivalent to the measurement system. Here, the load resistance is 2 kΩ. The power source 5 is a voltage pulse application device for driving the variable resistance element 10 and the current steering element 20, and can apply a voltage pulse having a predetermined polarity, voltage, and time width to the variable resistance element 10 and the current steering element 20. The result of measurement by such a measurement system will be described later.

<2.2 Method for Manufacturing Non-volatile Memory Element>

Next, an example of a method for manufacturing a non-volatile memory element will be described.

<2.2.1 Variable Resistance Element>

First, the first electrode 1 having a thickness of 30 nm is formed on a substrate by sputtering. Then, a metal oxide layer is formed on the first electrode 1 using reactive sputtering with which a target transition metal is treated with sputtering in argon gas and oxygen gas.

Here, the oxygen content percentage in the metal oxide layer can be easily adjusted by changing a flow ratio of the oxygen gas to the argon gas. The substrate does not have to be heated and the temperature of the substrate may be an ambient temperature.

The specific processes of sputtering when an oxygen-deficient tantalum oxide is used as the variable resistance layer 3 will be described as an example below.

First, a substrate is initially placed in a sputtering apparatus, and the inside of the sputtering apparatus is vacuumed up to approximately $7\times10^{-4}$ Pa. Sputtering is performed with tantalum as a target, power set to 250 W, a total gas pressure of the Ar gas and the oxygen gas set to 3.3 Pa, and a preset temperature of the substrate set to 30° C. It is preferred that the tantalum oxide layer to be formed has a thickness approximately between 30 nm and 100 nm inclusive. When the oxygen partial pressure ratio is changed from 1% to 7%, the oxygen content of the tantalum oxide layer changes from approximately 40% ($TaO_{0.66}$) to approximately 70% ($TaO_{2.3}$) (oxygen deficiency is changed approximately from 73% to 8%).

The composition of the tantalum oxide layer can be measured using Rutherford Backscattering Spectrometry (RBS).

Next, a metal oxide smaller in oxygen deficiency is formed by sputtering on the metal oxide layer formed as above, using a metal oxide smaller in oxygen deficiency and of the same kind (for example, $Ta_2O_5$) as a target. Alternatively, the top surface of the metal oxide layer formed first is oxidized to modify the surface property. Accordingly, a region (second region) smaller in oxygen deficiency is formed on the surface of the metal oxide layer (first region) formed first.

The first region and the second region correspond to the first transition metal oxide layer 3a and the second transition metal oxide layer 3b, respectively. The variable resistance layer 3 is formed from the first transition metal oxide layer 3a and the second transition metal oxide layer 3b formed as such.

Next, the second electrode 2 having a thickness of 80 nm is formed on the variable resistance layer 3, thereby obtaining the variable resistance element 10.

<2.2.2 Current Steering Element>

Next, the third electrode 6 having a thickness of 50 nm is formed by sputtering so as to be electrically connected to the second electrode 2.

Then, a silicon nitride that is the semiconductor layer 8 is formed on the third electrode 6 using reactive sputtering with which a target polycrystal silicon is treated with sputtering in argon gas and nitrogen gas.

Here, the nitrogen content percentage in the silicon nitride that is the semiconductor layer 8 can be easily adjusted by changing a flow ratio of the nitrogen gas to the argon gas.

For example, sputtering was performed with power set to 1300 W, a total gas pressure of the Ar gas and the oxygen gas set to 0.1 Pa, and a preset temperature of the substrate set to 20° C. When the nitrogen partial pressure ratio was changed from 5% to 35%, the nitrogen content percentage in the silicon nitride layer was continuously changed approximately from 9% ($SiN_{0.1}$) to 46% ($SiN_{0.85}$). Furthermore, when sputtering was performed with power set to 300 W, a total gas pressure of the Ar gas and the oxygen gas set to 0.4 Pa, and a preset temperature of the substrate set to 20° C., after the nitrogen partial pressure ratio was changed from 10% to 40%, the nitrogen content percentage in the silicon nitride layer was continuously changed approximately from 34% ($SiN_{0.52}$) to 58% ($SiN_{1.38}$). It is preferred that the silicon nitride layer to be formed has a thickness between 5 nm and 30 nm inclusive.

The composition of the silicon nitride layer can be measured using the Rutherford backscattering spectrometry (RBS).

Next, the fourth electrode 7 having a thickness of 50 nm is formed by sputtering on the semiconductor layer 8 formed as above, thus forming an MSM diode as the current steering element 20, and obtaining the non-volatile memory element 100 in which the current steering element 20 is connected in series with the variable resistance element 10.

Here, the second electrode 2 may be connected to the third electrode 6 through a contact plug using general semiconductor processes, and the second electrode 2 may be formed directly on the third electrode 6. The present invention does not limit a structure for electrically connecting the second electrode 2 to the third electrode 6.

Furthermore, the current steering element 20 may be formed on the variable resistance element 10, and conversely, the variable resistance element 10 may be formed on the current steering element 20. According to the present invention, the current steering element 20 has only to be connected in series with the variable resistance element 10, and positions of the current steering element 20 and the variable resistance element 10 with respect to the substrate are not limited.

<2.3 Method for Driving Nonvolatile Memory Element>

Next, a method for driving the non-volatile memory element 100 structured as above according to Embodiment 1 will be described.

The following will separately describe the initialization process and the normal resistance change operations (hereinafter referred to as "normal operations"). First, the normal operations will be described, and then the initialization process will be described.

<2.3.1 Normal Operations>

The normal operations of the nonvolatile memory element 100 will be described. In the following description, a first high resistance state represents a state in which the variable resistance layer 3 has a predetermined high resistance value (for example, several hundred kΩ with the measurement voltage of 3.5 V), and a low resistance state represents a state in which the variable resistance layer 3 has a predetermined low resistance value (for example, several tens of kΩ with the measurement voltage of 3.5 V).

The normal operations include three processes: a writing process for changing the resistance value of the variable resistance layer 3 from the first high resistance state to the low resistance state; an erasing process for changing the resistance value of the variable resistance layer 3 from the low resistance state to the first high resistance state; and a reading process for determining whether the variable resistance layer 3 is in the low resistance state or the first high resistance state.

In the writing process, a writing voltage pulse having a polarity with which the second electrode 2 has a negative polarity with respect to the first electrode 1 is applied to the non-volatile memory element 100 using the power source 5. Such a polarity will be hereinafter called a negative polarity for simplifying the description. The voltage to be applied to the non-volatile memory element 100 is determined so that the absolute value of a divided voltage applied to the variable resistance element 10 is larger than a predetermined writing threshold voltage (low resistance start voltage). With application of such a writing pulse, the resistance value of the variable resistance layer 3 decreases, and the variable resistance layer 3 is changed from the first high resistance state to the low resistance state.

In the erasing process, an erasing voltage pulse having a polarity with which the second electrode 2 has a positive polarity with respect to the first electrode 1 is applied to the non-volatile memory element 100 using the power source 5. Such a polarity will be hereinafter called a positive polarity for simplifying the description. The voltage to be applied to the non-volatile memory element 100 is determined so that the absolute value of a divided voltage applied to the variable resistance element 10 is larger than a predetermined erasing threshold voltage (high resistance start voltage). With application of such an erasing pulse, the resistance value of the variable resistance layer 3 increases, and the variable resistance layer 3 is changed from the low resistance state to the first high resistance state.

In the case where the variable resistance layer 3 is in the low resistance state, even when a voltage pulse having the negative polarity as the polarity of the writing voltage pulse is applied between the first electrode 1 and the second electrode 2, the variable resistance layer 3 remains in the low resistance state without change. Similarly, in the case where the variable resistance layer 3 is in the high resistance state, even when a voltage pulse having the positive polarity as the polarity of the erasing voltage pulse is applied between the first electrode 1 and the second electrode 2, the variable resistance layer 3 remains in the first high resistance state without change.

In the reading process, it is determined whether the variable resistance element 10 is in the first high resistance state or the low resistance state by applying a reading voltage pulse smaller in absolute value than the predetermined writing threshold voltage and the erasing threshold voltage, between the first electrode 1 and the second electrode 2, and comparing the reading current obtained as a result of the voltage application with the reference current.

<2.3.2 Initialization Process>

The initialization process is a process for applying a voltage pulse larger in absolute value than a voltage pulse used in the normal operations, to the variable resistance element 10 so that the resistance value of the variable resistance element 10 is reduced to a resistance range in which the normal operations can be performed from the initial resistance value (for example, resistance value in a second high resistance state lower than the initial resistance value).

The driving method according to the present invention is characterized by performing such an initialization process with application of an initial voltage pulse having the positive polarity identical to that of the erasing voltage pulse for setting the variable resistance element 10 to the high resistance state in the erasing process included in the normal processes.

In other words, in the initialization process of the driving method, the initial voltage pulse having a polarity with which the second electrode has a positive polarity with respect to the first electrode 1 in the variable resistance element 10 is applied to the non-volatile memory element 100 immediately after being manufactured, using the power source 5. Since the initial voltage pulse has the positive polarity identical to that of the erasing voltage pulse for setting the variable resistance element 10 to the high resistance state in the normal operations, reduction in the resistance value of the variable resistance element 10 starts from the initial resistance value and ends in the first high resistance state used in the normal operations, in such an initialization process.

Conversely, when the initialization process is performed with a voltage pulse having a reversed polarity (that is, negative polarity identical to the polarity of the writing voltage pulse for setting the variable resistance element 10 to the low resistance state in the normal operations), there is a possibility that the resistance value of the variable resistance element 10 sharply drops to the low resistance state over the first high resistance state used in the normal operations.

When the driving method according to the present invention is performed on the variable resistance element 10 having a high initial resistance value due to substantially flattening the interface between the second electrode 2 and the second transition metal oxide layer 3b, using the initialization voltage pulse having a larger absolute value in the initialization process is a premise.

When the resistance value of the variable resistance element 10 decreases to the low resistance state in a state where the initialization voltage pulse having a larger absolute value is applied to the non-volatile memory element 100 in the initialization process, one or both of (i) the divided voltage to be applied to the current steering element 20 out of the voltage pulse to be applied and (ii) the current that flows through the current steering element 20 is or are at increased risk of exceeding a rating of the current steering element 20.

Thus, the variable resistance element 10 is initialized by applying, to the non-volatile memory element 100, the initialization voltage pulse having the positive polarity identical to that of the erasing voltage pulse for changing the variable resistance element 10 from the low resistance state to the first high resistance state in the normal operations as described above.

Since the resistance value of the variable resistance element 10 does not sharply drop to the low resistance state over the first high resistance state in such an initialization process, the variable resistance element 10 maintained larger than or equal to a resistance value in the first high resistance state can control the current flowing through the non-volatile memory element 100, while the resistance value of the variable resistance element 10 can be reduced from the initial resistance value higher than the resistance value in the first high resistance state to a resistance value in the second high resistance state lower than the initial resistance value.

Since the initialization process of the non-volatile memory element 100 is performed with application of an initialization voltage pulse having a positive polarity identical to that of the erasing voltage pulse to be used for changing the resistance state to the high resistance state in the erasing process within the normal operations, the resistance state of the variable resistance element 10 does not excessively change to the low resistance state. As a result, the risk that the current steering element 20 may be destroyed in the initialization process can be more reduced than the case where the initialization process is performed with application of a voltage pulse having a reversed polarity.

<2.4 Embodiment>

The present invention will be described according to an embodiment in detail. However, the present invention is not limited to the embodiment.

In this embodiment, the non-volatile memory element 100 was manufactured under the following conditions, and the electric characteristics were actually measured.

In the non-volatile memory element 100, each of the second electrode 2 and the variable resistance layer 3 has a dimension of 0.5 μm×0.5 μm (area 0.25 μm$^2$), and a portion in which the first electrode 1 is in contact with the variable resistance layer 3 also has a dimension of 0.5 μm×0.5 μm (area 0.25 μm$^2$). Furthermore, each of the fourth electrode 7 and the semiconductor layer 8 also has a dimension of 0.5 μm×0.5 μm (area 0.25 μm$^2$), and a portion in which the third electrode 6 is in contact with the semiconductor layer 8 also has a dimension of 0.5 μm×0.5 μm (area 0.25 μm$^2$).

The first electrode 1 comprises TaN, and has a thickness of 30 nm. The second electrode 2 comprises Ir, and has a thickness of 80 nm. The composition of the first transition metal oxide layer 3a is TaO$_x$ (x=1.54), and the composition of the second transition metal oxide layer 3b is TaO$_y$ (y=2.47). Furthermore, the variable resistance layer 3 has a thickness of 50 nm, the first transition metal oxide layer 3a has a thickness of 46 nm, and the second transition metal oxide layer 3b has a thickness of 4 nm.

Each of the third electrode 6 and the fourth electrode 7 comprises TaN, and has a thickness of 50 nm. The semiconductor layer 8 comprises a silicon nitride, the composition is SiN$_z$ (z=0.3), and has a thickness of 20 nm.

In order to clarify the characteristics of the current steering element 20, individual samples of the current steering element in each of which only the third electrode 6, the semiconductor layer 8, and the fourth electrode 7 are formed on the substrate were manufactured, and the current-voltage characteristics of the individual samples were measured.

Figure 8:
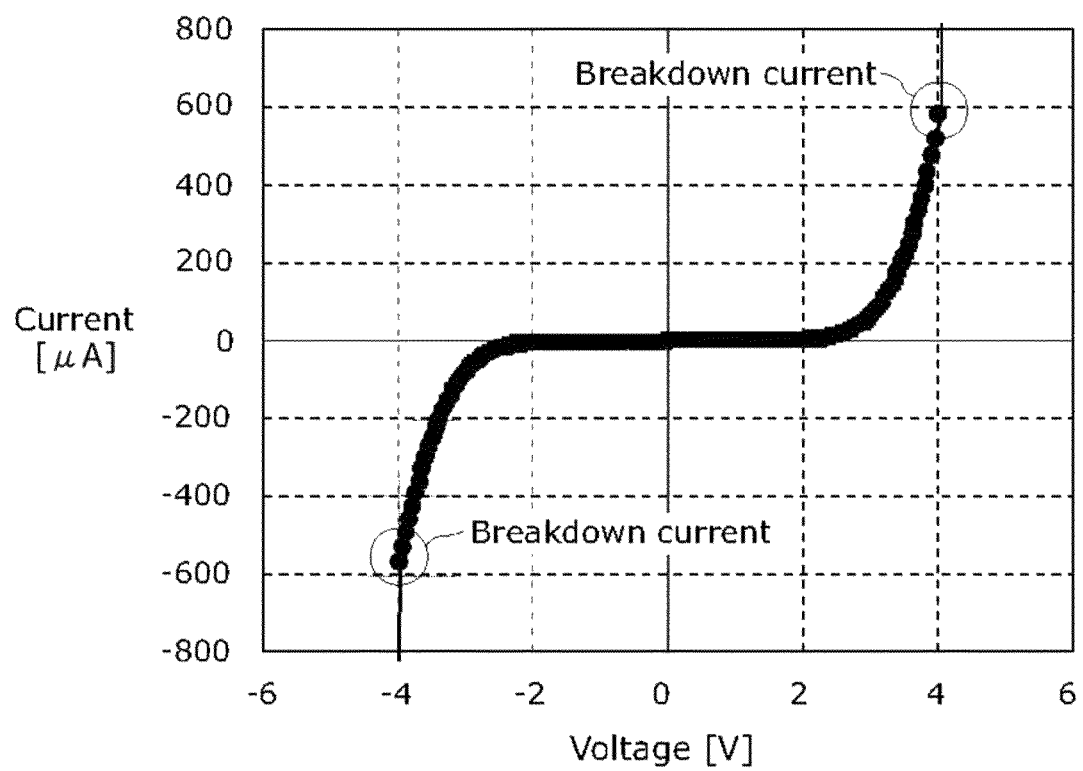
FIG. 8 is a graph indicating the current-voltage characteristics obtained by measuring the individual samples of the current steering element.

FIG. 8 is a graph indicating the current-voltage characteristics obtained by measuring the individual samples of the current steering element. In the current-voltage measurement, the current values were measured by sequentially applying a voltage pulse with a pulse width of 500 ns to the current steering element, and measuring a voltage of a load resistor connected in series with the current steering element, using an oscilloscope. Furthermore, the positive current-voltage characteristics and the negative current-voltage characteristics were separately measured using different elements (because the measurement was ended with destruction of the current steering element).

A certain individual sample was destroyed with application of a voltage of +4 V, and the current that has flown immediately before the destruction, that is, the possible positive peak current (current-steering-element breakdown current) was +583 μA. Furthermore, a certain individual sample was destroyed with application of a voltage of −4 V, and the possible negative peak current was −569 μA.

FIG. 8 shows that the variable resistance element 10 can probably be initialized without destroying the current steering element 20 by limiting the peak current that flows through the current steering element 20 (variable-resistance-element initialization current) smaller than the current-steering-element breakdown current, in the initialization process of the non-volatile memory element 100.

<2.4.1 Initialization Process>

In order to observe the behaviors of the non-volatile memory element 100 in the initialization process, voltage pulses having a positive polarity with which the second electrode 2 has a positive polarity with respect to the first electrode 1 were applied to the non-volatile memory element 100 while increasing the amplitude from 0.1 V in increments of 0.1 V. Then, the resistance value and the current of the non-volatile memory element 100 were measured each time the voltage pulses were applied.

Figure 9:
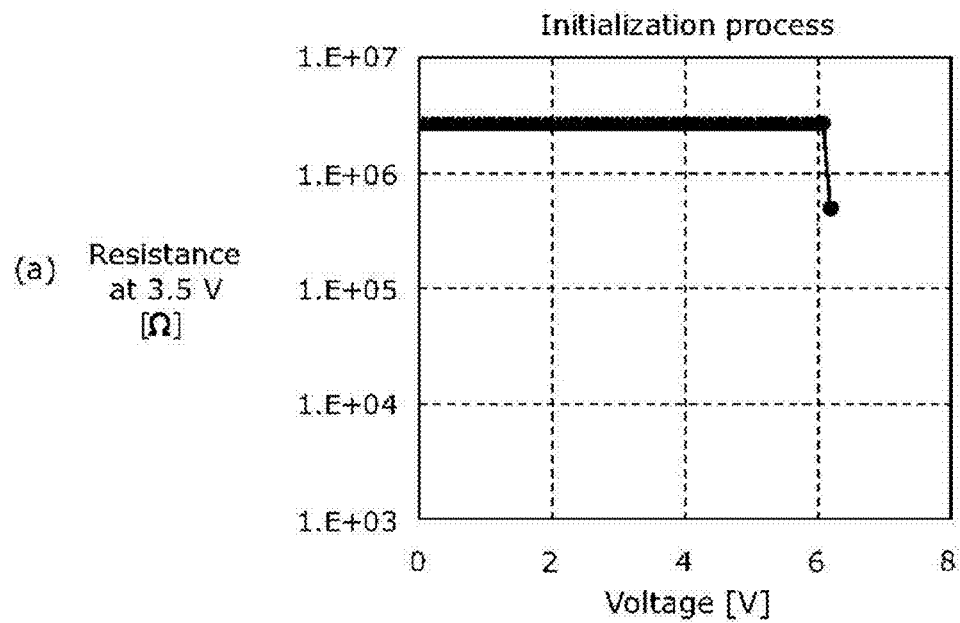
FIGS. 9 (*a*) and (*b*) are graphs each indicating the resistance value and the current of the non-volatile memory element that were measured each time a voltage pulse was applied in the initialization process.
Figure 9:
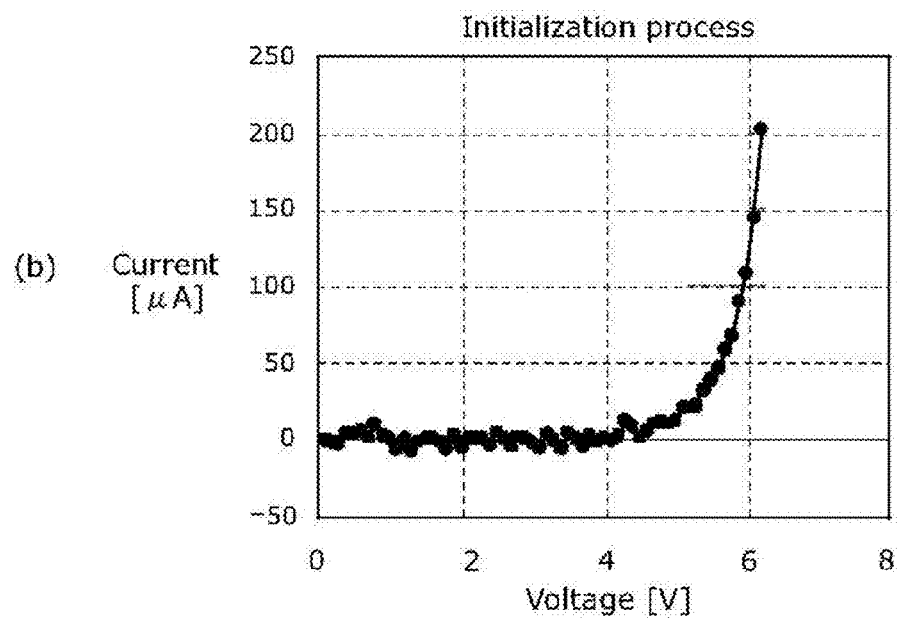

FIG. 9 (a) is a graph indicating the resistance value of the non-volatile memory element 100 measured according to the application of each voltage pulse. FIG. 9 (b) is a graph indicating the current of the non-volatile memory element 100 measured according to the application of each voltage pulse. Each of the voltage pulses has a pulse width of 500 ns.

As illustrated in FIG. 9 (a), the resistance value of the non-volatile memory element 100 did not change from the initial resistance value of approximately 2.5 MΩ with application of a voltage pulse with amplitude of 0.1 V to 6.1 V inclusive. Furthermore, the resistance value abruptly decreased with application of the voltage pulse with amplitude of 6.2 V, and the variable resistance element 10 was initialized.

After the initialization, the non-volatile memory element 100 had the resistance value of approximately 500 kΩ (second high resistance state) with application of a measurement voltage of 3.5 V. Since the resistance value is identical to the resistance value when the non-volatile memory element 100 is in the first high resistance state in the normal operations, it is clarified that the reduction in the resistance value of the non-volatile memory element 100 in the initialization process of the embodiment started from the initial resistance value and ended at the first high resistance state.

FIG. 9 (*b*) shows that the initialization current that is necessary for initializing the variable resistance element 10 was larger than the largest current value of 144 μA with which the initialization did not occur, and that the initialization current 202 μA flowed through the non-volatile memory element 100 after initialization of the variable resistance element 10.

The sharp increase in the current caused by initializing the variable resistance element 10 will be described as follows.

According to the current-voltage characteristics in FIG. 8, subtle increase in voltage causes the abrupt increase in current when a current ranging from 144 μA to 202 μA flows through the current steering element 20.

As such, when the initialization current of the variable resistance element 10 is larger than an OFF current of the current steering element 20 and the resistance value of the variable resistance element 10 decreases according to the initialization, the divided voltage of the current steering element 20 in the voltage applied to the non-volatile memory element 100 increases, and the current abruptly increases. As the resistance value of the variable resistance element 10 after the initialization is larger, increase in the divided voltage of the current steering element 20 can be more suppressed.

Thus, when the initialization process is performed with application of a voltage pulse having a positive polarity with which the second electrode 2 has a positive polarity with respect to the first electrode 1, the variable resistance element 10 after the initialization is set to the second high resistance state higher in resistance value than the first high resistance state, and the variable resistance element 10 maintained in the second high resistance state can control the current that flows through the non-volatile memory element 100. Thus, it is possible to reduce the risk that the current steering element 20 may be destroyed.

<2.4.2 Writing Process and Erasing Process>

Next, voltage pulses having a negative polarity with which the second electrode 2 has a negative polarity with respect to the first electrode 1 were applied to the non-volatile memory element 100 with amplitude increased up to 4.5 V from 0.1 V in increments of 0.1 V and then decreased to 0.1 V. The current that flows through the non-volatile memory element 100 during the application of the voltage pulses and the resistance value of the non-volatile memory element 100 after application of the voltage pulses were measured.

Figure 10:
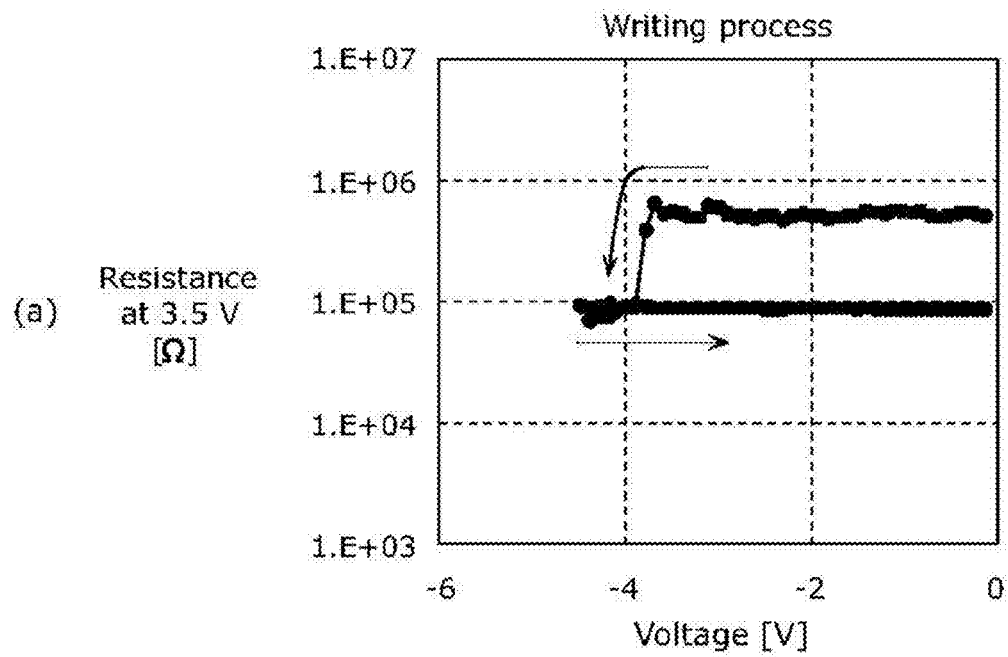
FIGS. 10 (*a*) and (*b*) are graphs each indicating the resistance value and the current of the non-volatile memory element that were measured each time a voltage pulse was applied in the writing process.
Figure 10:
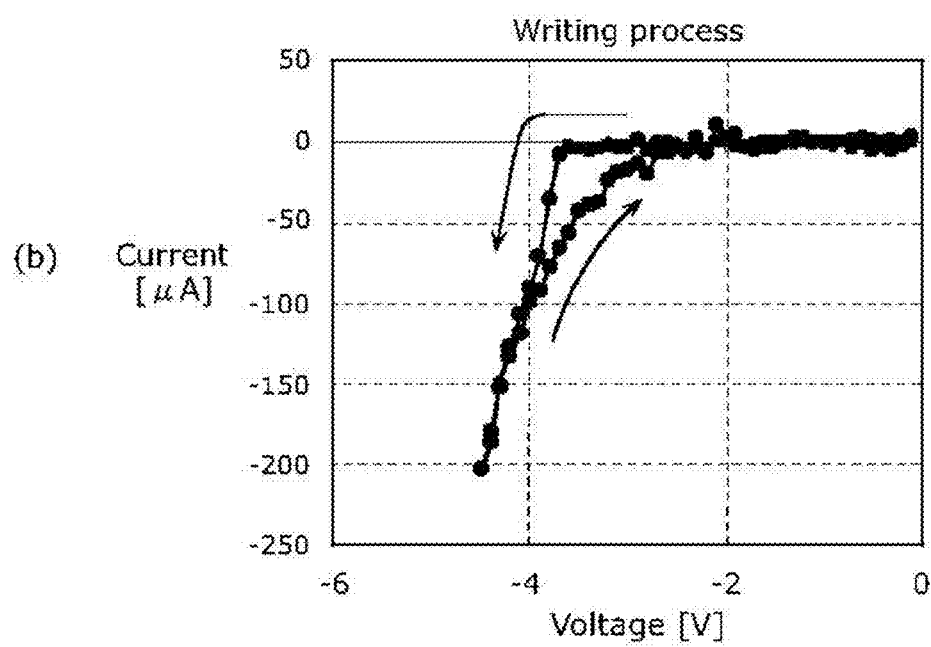

FIGS. 10 (*a*) and (*b*) are graphs representing the resistance values (FIG. 10 (*a*)) and the currents (FIG. 10 (*b*)) of the non-volatile memory element 100 measured each time the voltage pulse was applied. Each of the voltage pulses has a pulse width of 500 ns.

The resistance value of the non-volatile memory element 100 hardly changed and stayed around 500 kΩ (first high resistance state) with application of a voltage pulse with amplitude of 0.1 V to 3.8 V inclusive. The resistance value abruptly decreased approximately to 90 kΩ (low resistance state) with application of the voltage pulse with amplitude of 3.9 V. Then, with application of the voltage pulse having a smaller amplitude, the low resistance state was maintained. The process is the writing process.

FIG. 10 (*b*) shows that the maximum value of the current that flowed at that time was approximately 200 μA.

Next, voltage pulses with a positive polarity with which the second electrode 2 has a positive polarity with respect to the first electrode 1 were applied to the non-volatile memory element 100 with increasing amplitude up to 5.5 V from 0.1 V in increments of 0.1 V and then decreased to 0.1 V. The currents that flowed through the non-volatile memory element 100 during application of the voltage pulses and the resistance values of the non-volatile memory element 100 after application of the voltage pulses were measured.

Figure 11:
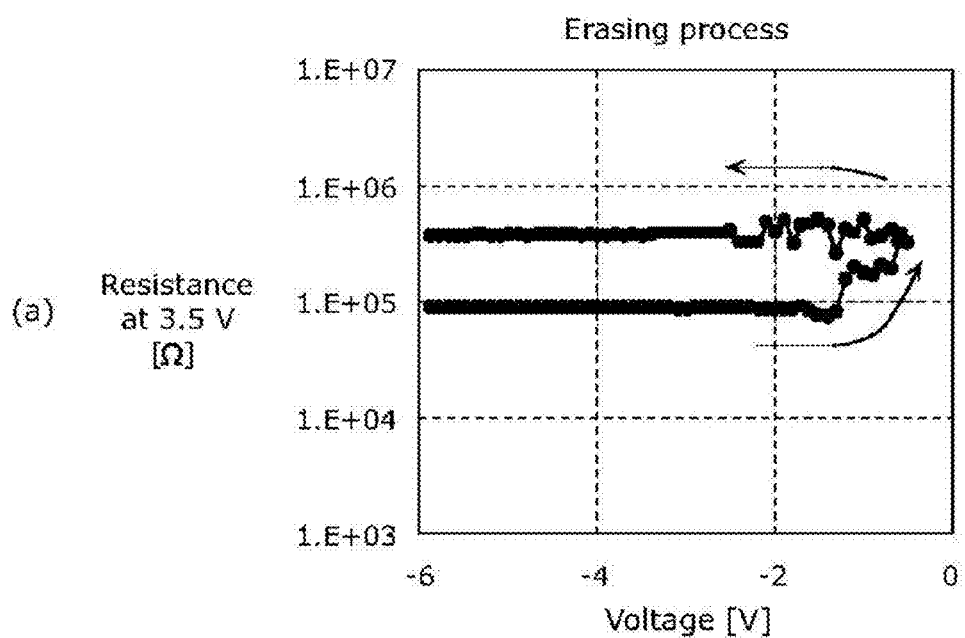
FIGS. 11 (*a*) and (*b*) are graphs each indicating the resistance value and the current of the non-volatile memory element that were measured each time a voltage pulse was applied in the erasing process.
Figure 11:
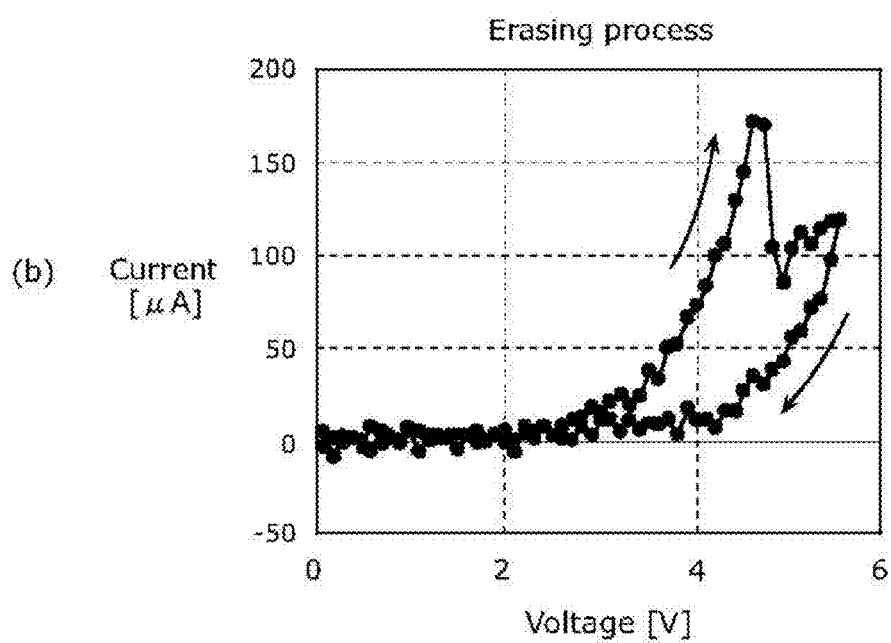

FIGS. 11 (*a*) and (*b*) are graphs representing the resistance values (FIG. 11 (*a*)) and the currents (FIG. 11 (*b*)) of the non-volatile memory element 100 measured each time the voltage pulse was applied. Each of the voltage pulses has a pulse width of 500 ns.

The resistance value of the non-volatile memory element 100 hardly changed and stayed around 90 kΩ (low resistance state) with application of voltage pulses with amplitude of 0.1 V to 4.7 V inclusive. The resistance value increased with application of the voltage pulse with amplitude of 4.8 V. The resistance value increased approximately to 300 kΩ (first high resistance state) with application of the voltage pulse with amplitude up to 5.5 V. Then, even when the voltage pulses having a smaller amplitude were applied, the first high resistance state was maintained. The process is the erasing process.

FIG. 11 (*b*) shows that the maximum value of the current that flowed at that time was approximately 170 μA.

Figure 12:
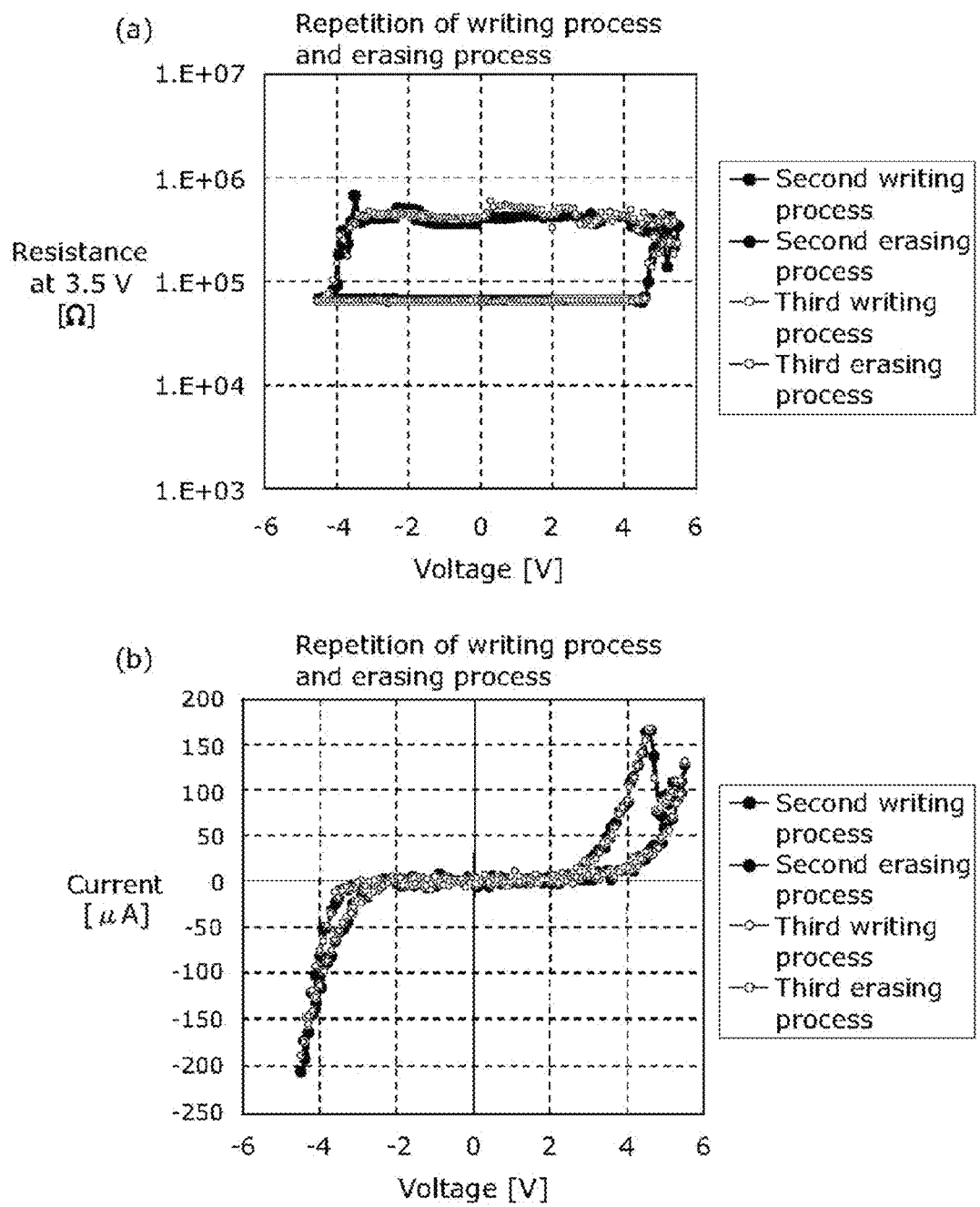
FIGS. 12 (*a*) and (*b*) are graphs each indicating the resistance value and the current of the non-volatile memory element that were measured when the writing process and the erasing process were repeated twice.

FIGS. 12 (*a*) and (*b*) are graphs representing change in the resistance value (FIG. 12 (*a*)) and the current (FIG. 12 (*b*)) of the non-volatile memory element 100 measured when the writing process and the erasing process were repeated twice. Each of the voltage pulses has a pulse width of 500 ns.

FIGS. 12 (*a*) and (*b*) show that the non-volatile memory element 100 can stably and repeatedly transition between the low resistance state (approximately 70 kΩ) and the first high resistance state (500 kΩ) with application of a writing voltage of −4.5 V and an erasing voltage of 5.5 V.

Figure 13:
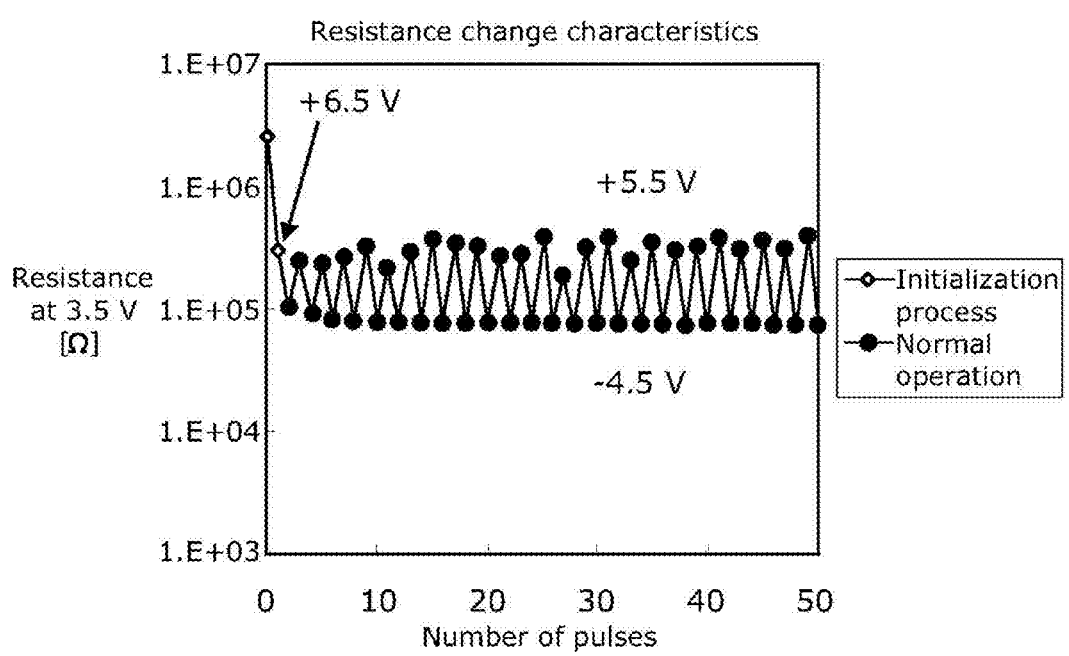
FIG. 13 is a graph representing the resistance change characteristics when the non-volatile storage element was repeatedly operated.

FIG. 13 is a graph representing states of resistance change in the non-volatile memory element 100 that was initialized with application of an initialization voltage of 6.5 V, and was operated repeatedly with the writing voltage of −4.5 V and the erasing voltage of 5.5 V. Each of the voltage pulses has a pulse width of 500 ns.

The graph shows that the resistance value decreased from an initial resistance value of approximately 2.5 MΩ to approximately 300 kΩ in a second high resistance state, and was then stable between the low resistance state (70 kΩ to 100 kΩ) and the first high resistance state (200 kΩ to 400 kΩ). In this example, the first high resistance state and the second high resistance state are included in the same resistance range.

<2.5 Comparison Example>

A driving method as an example in comparison with the above embodiment will be hereinafter described. The driving method as the comparison example is different from the driving method according to the embodiment in that the initialization process is performed with application of a voltage pulse having the negative polarity. The driving method as the comparison example is performed on the nonvolatile memory element 100 similarly as the driving method according to the embodiment. The description of the nonvolatile memory element 100 is omitted herein.

In the driving method as the comparison example, voltage pulses having a negative polarity with which the second electrode 2 has a negative polarity were applied to the non-volatile memory element 100 with increasing amplitude from 0.1 V up to 5.8 V in increments of 0.1 V (initialization process). Next, voltage pulses having a positive polarity with which the second electrode 2 has a positive polarity with respect to the first electrode 1 were applied to the non-volatile memory element 100 with increasing amplitude from 0.1 V to 5.8 V in increments of 0.1 V (erasing process). Then, the currents that flowed through the non-volatile memory element 100 during application of the voltage pulses and the resistance values after application of the voltage pulses were measured.

Figure 14:
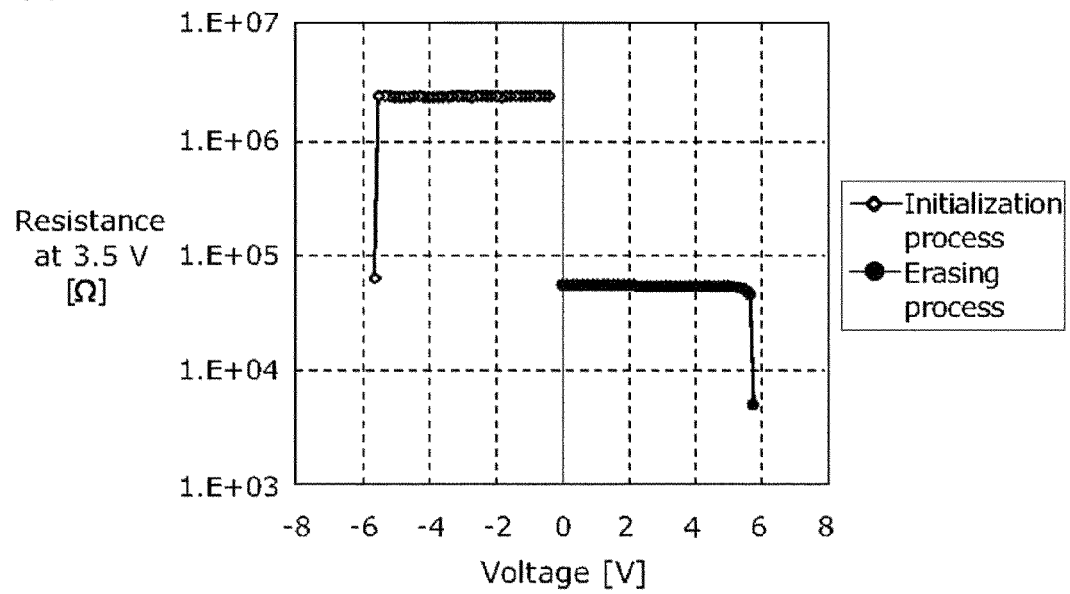
FIGS. 14 (a) and (b) are graphs each indicating the resistance value and the current of the non-volatile memory element that were measured each time a voltage pulse was applied in the initialization process and the erasing process as a comparison example.
Figure 14:
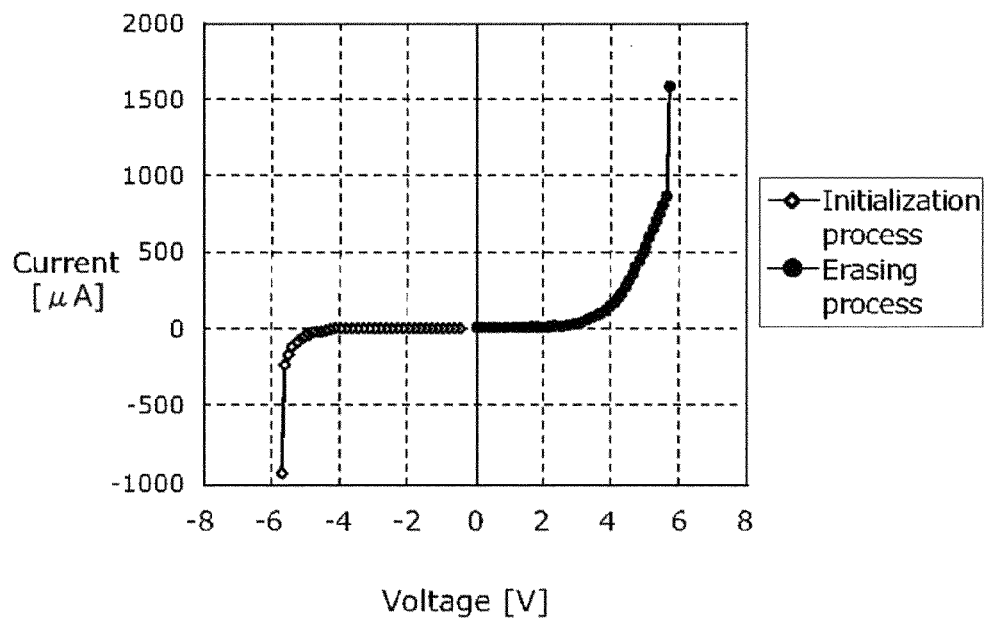

FIG. 14 (a) is a graph representing the resistance values of the non-volatile memory element 100 after application of each of the voltage pulses, and FIG. 14 (b) is a graph representing the currents that flowed through the non-volatile memory element 100 during the application. Each of the voltage pulses has a pulse width of 500 ns.

As illustrated in FIG. 14 (a), in the initialization process, the resistance values of the non-volatile memory element 100 did not change from its initial state with application of the negative voltage pulses with amplitude from 0.1 V to 5.6 V inclusive; however, the resistance values abruptly decreased with application of the negative voltage pulses with amplitude of 5.7 V, thus clearly showing that the variable resistance element 10 has been initialized. After the initialization, the non-volatile memory element 100 had the resistance value of approximately 60 kΩ with application of a measurement voltage of 3.5 V. Since the resistance values were of the non-volatile memory element 100 in the low resistance state, it is clear that reduction in the resistance values of the non-volatile memory element in the initialization process for the comparison example started from the initial resistance value, and the non-volatile memory element was led immediately to the low resistance state.

FIG. 14 (b) shows that the absolute value of the initialization current necessary for initializing the variable resistance element 10 is larger than the absolute value of the minimum value −230 µA of the current with which the initialization did not occur, and after the variable resistance element 10 has been initialized, the initialization current of −929 µA flowed.

The initialization current of −929 µA has a large absolute value enough to destroy the current steering element 20 according to FIG. 8. Although the non-volatile memory element 100 maintained the resistance values of approximately 60 kΩ, it has been probably partially destroyed.

Next, in the erasing process, the resistance values of the non-volatile memory element 100 hardly changed with application of the positive voltage pulse with amplitude of 0.1 V to 5.7 V inclusive; however, the resistance values abruptly decreased with application of the positive voltage pulse with amplitude of 5.8 V as shown in FIG. 14(a).

FIG. 14 (b) shows that the current steering element 20 has been probably destroyed because the current abruptly increased with application of the positive voltage pulse with amplitude of 5.8 V. The current value immediately before the destruction was 853 µA that is large enough to destroy the current steering element 20.

The result shows that it is highly likely that the current steering element 20 may be destroyed with a larger current and that the resistance change operation cannot be performed, when the initialization process is performed by applying, to the non-volatile memory element 100, the voltage pulses with a negative polarity with which the second electrode 2 has a negative polarity with respect to the first electrode 1.

3. Embodiment 2

A non-volatile memory device according to Embodiment 2 of the present invention will be described in detail with reference to drawings.

The non-volatile memory device includes (i) a memory cell array in which memory cells using the non-volatile memory elements 100 according to Embodiment 1 are arranged in an array and (ii) a driving unit that drives each of the memory cells according to the driving method according to Embodiment 1.

<3.1 Structure of Nonvolatile Memory Device>

Figure 15:
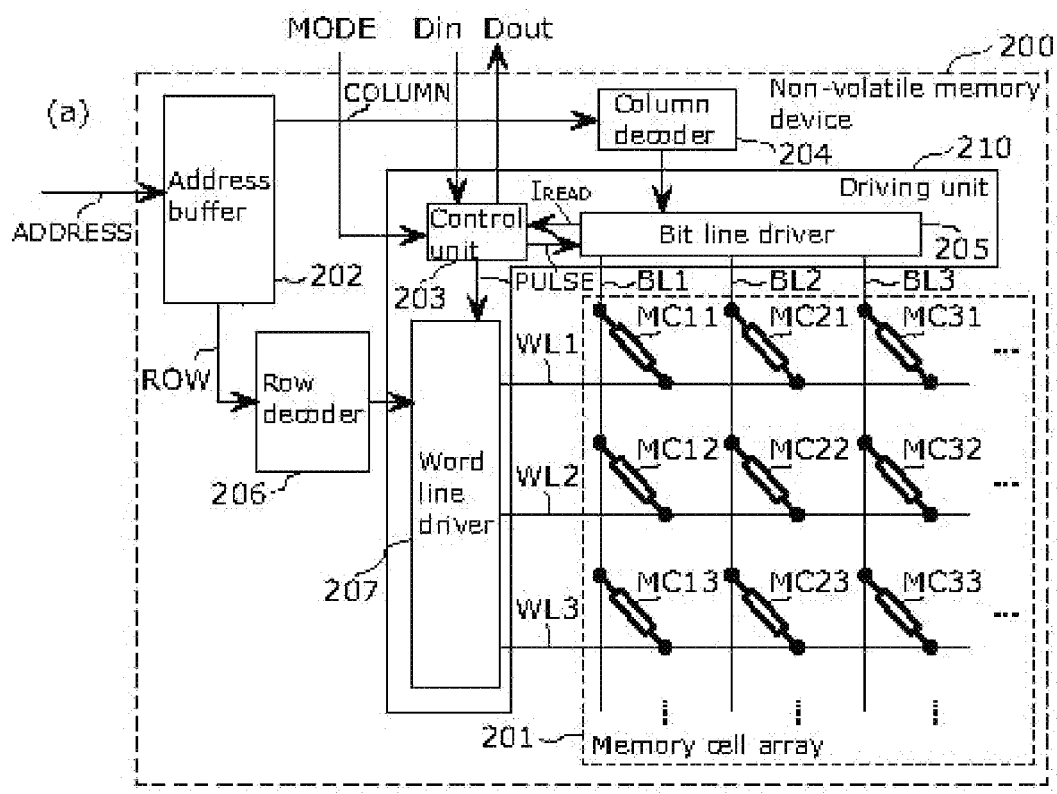
FIG. 15 (a) is a block diagram illustrating a functional structure of a non-volatile memory device according to Embodiment 2, FIG. 15 (b) is an equivalent circuit diagram of a memory cell, and FIG. 15 (c) schematically illustrates a structure of the memory cell.
Figure 15:
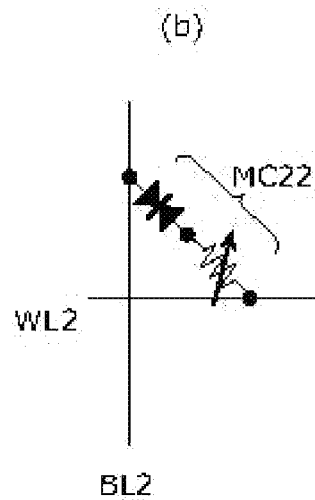
Figure 15:
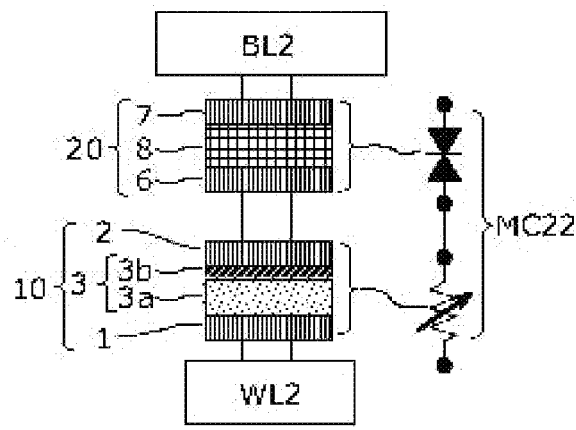
Figure 16:
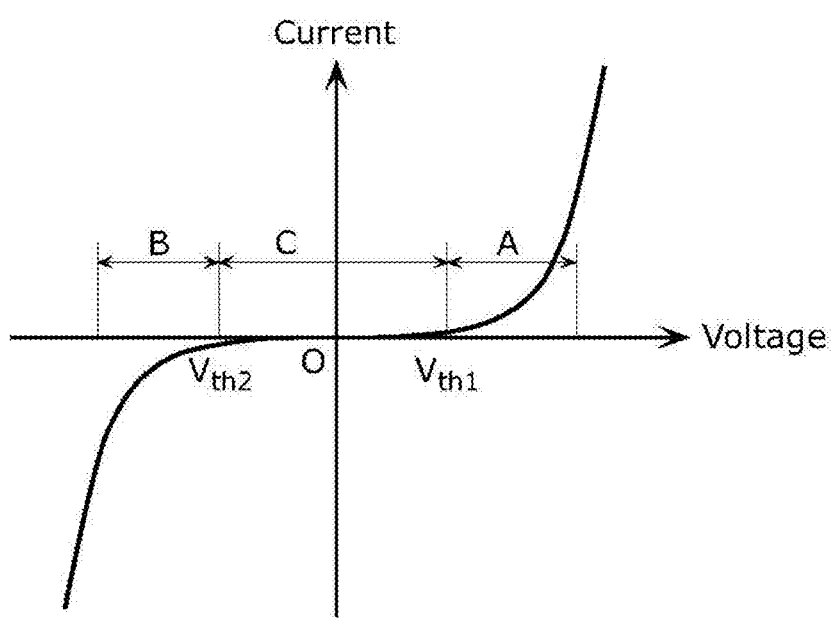
FIG. 16 illustrates voltage-current characteristics of a generally-known bidirectional diode.

FIG. 15 (a) is a block diagram illustrating a functional structure of a non-volatile memory device 200 according to Embodiment 2 in the present invention.

As illustrated in FIG. 15 (a), the non-volatile memory device 200 includes a memory cell array 201 including variable resistance elements and current steering elements, an address buffer 202, a control unit 203, a row decoder 206, a word line driver 207, a column decoder 204, and a bit line driver 205. Furthermore, the non-volatile memory device 200 normally includes a sense amplifier (not illustrated) for measuring a resistance value of each of the memory cells, between the column decoder 204 and the memory cell array 201. Here, the control unit 203, the word line driver 207, and the bit line driver 205 are collectively referred to as a driving unit 210.

The memory cell array 201 includes (i) word lines WL1, WL2, WL3, . . . that are parallel to each other and extend in a horizontal direction, and (ii) bit lines BL1, BL2, BL3, . . . that cross the word lines WL1, WL2, WL3, . . . , are parallel to each other, and extend in a vertical direction as illustrated in FIG. 15 (a).

Here, the word lines WL1, WL2, WL3, . . . are formed in a first plane parallel to the main surface of the substrate (not illustrated), and the bit lines BL1, BL2, BL3, . . . are formed in a second plane that is higher or lower than the first plane and is substantially parallel to the first plane.

Thus, the word lines WL1, WL2, WL3, . . . three-dimensionally cross the bit lines BL1, BL2, BL3, . . . , and memory cells MC11, MC12, MC13, MC21, MC22, MC23, MC31, MC32, MC33, . . . are provided to correspond to the three-dimensional cross-points.

Each of the memory cells MC11, MC12, . . . is the non-volatile memory element 100 according to Embodiment 1.

FIG. 15 (b) is an equivalent circuit diagram of the memory cell MC22 in FIG. 15 (a), and FIG. 15 (c) schematically illustrates a structure of the memory cell MC22. FIG. 15 (c) illustrates again the cross-section of the structure of the non-volatile memory element 100 in FIG. 7.

As illustrated in FIGS. 15 (b) and (c), the variable resistance element 10 and the current steering element 20 included in the memory cell MC22 are equivalently represented as a variable resistor and a bidirectional diode, respectively.

In the Description, the low resistance state and the first high resistance state of the variable resistance element 10 included in each of the memory cells are expressed as "1" and "0" of one bit data, respectively.

The address buffer 202 receives an address signal ADDRESS from an external circuit (not illustrated), and then, based on the received address signal ADDRESS, provides a row address signal ROW to the row decoder 206 and a column address signal COLUMN to the column decoder 204. Here, the address signal ADDRESS indicates an address of a memory cell selected from among the memory cells MC12, MC21, . . . . In addition, the row address signal ROW is a signal indicating an address of a row among addresses indicated in the address signal ADDRESS. The column address signal COLUMN is a signal indicating an address of a column among the addresses.

The control unit 203 receives a mode selection signal MODE and input data Din from the external circuit, and selects one of an initialization mode, a write mode, and a read mode, based on the mode selection signal MODE. Furthermore, the control unit 203 selects one of a low resistance mode ([1] write mode) and a high resistance mode ([0] write mode) according to the input data Din.

Here, the initialization mode, the low resistance mode, and the high resistance mode correspond to the initialization process, the writing process, and the erasing process according to Embodiment 1, respectively. The control unit 203 determines an appropriate polarity and the magnitude of a voltage to be applied to a memory cell, according to the selected mode, so that the driving method according to Embodiment 1 is implemented. The magnitude of the voltage is determined to be larger than or equal to a sum of a voltage to be applied to the variable resistance element 10 and an amount of voltage drop caused in the current steering element 20.

The main feature of the control unit 203 is to determine the same polarity for both of the initialization mode and the high resistance mode. The control unit 203 determines a polarity of a voltage pulse to be applied to a memory cell as a positive polarity with which the bit line has a positive polarity with respect to the word line in the initialization mode and the high resistance mode, and the polarity as a negative polarity with which the bit line has a negative polarity with respect to the word line in the low resistance mode.

The control unit 203 applies voltage pulses PULSE to one or both of the word line driver 207 and the bit line driver 205 so as to apply the voltage pulse having the determined polarity and magnitude to the memory cells.

The column decoder 204 receives the column address signal COLUMN from the address buffer 202, and instructs one of the bit lines B1, B2, B3, . . . to be selected, to the bit line driver 205 according to the column address signal COLUMN.

The row decoder 206 receives the row address signal ROW from the address buffer 202, and instructs one of the word lines WL1, WL2, WL3, . . . to be selected, to the word line driver 207 according to the row address signal ROW.

The word line driver 207 and the bit line driver 205 apply the voltage pulses PULSE given from the control unit 203, between the word line and the bit line that are instructed. Accordingly, a voltage pulse having a polarity and a magnitude that are desired is applied between the first electrode 1 and the fourth electrode 7 of the selected memory cell.

The bit line driver 205 includes a sensing circuit capable of measuring a current flowing through the bit lines according to the application of the voltage pulse, or a voltage generated in the memory cells.

In the read mode, for example, the bit line driver 205 measures the current flowing through the bit lines according to the application of the voltage pulse PULSE for reading, and outputs, to the control unit 203, a signal $I_{READ}$ indicating the measured current value. The control unit 203 outputs, to the external circuit, output data Dout indicating the bit value corresponding to the received signal $I_{READ}$.

The non-volatile memory device 200 according to Embodiment 2 is described as a single-layer cross point memory device including a memory cell array of one layer; however, the non-volatile memory device 200 may be a multiple-layer cross point memory device including memory cell arrays of stacked layers.

Furthermore, the positional relationship between the variable resistance element and the current steering element may be reversed. More specifically, the bit line and the word line may be connected to the variable resistance element and the current steering element, respectively.

<3.2 Operation of Nonvolatile Memory Device>

An example of operations of the non-volatile memory device 200 structured as above will be described for each of the initialization mode, the write mode, and the read mode.

Since known methods are available for selecting a bit line and a word line and for applying a voltage pulse, the methods are not described in detail below.

The initializing, writing of data, and reading of data performed on the memory cell MC22 will be hereinafter described as an example. The polarity and magnitude of a voltage are represented with respect to a voltage of the word line WL2, that is, a voltage of the first electrode 1 of the variable resistance element 10 of the memory cell MC22 for simplification.

<3.2.1 Initialization Process>

The initialization process is performed in the initialization mode with application of an initialization voltage pulse $V_0$ at one time to the memory cells or the initialization voltage pulse $V_0$ sequentially one by one to all of the memory cells.

In the initialization process, for example, each of the bit lines is grounded by the bit line driver 205, and each of the word lines is electrically connected to the control unit 203 by the word line driver 207. Then, the control unit 203 applies the initialization voltage pulse $V_0$ to each of the word lines. Here, the initialization voltage pulse $V_0$ to be applied to the memory cells has, for example, a voltage value of +6.5 V and a pulse width of 500 ns.

With the aforementioned operations, the initialization voltage pulse $V_0$ having a positive polarity is applied at one time to all of the memory cells or one by one to the memory cells, and the resistance values of all the memory cells are reduced from resistance values in the initial resistance R0 to resistance values in the second high resistance state RH'. The second high resistance state RH' may be included in the same resistance range including the first high resistance state.

<3.2.2 Writing Process>

In the low resistance mode ([1] write mode), the writing process is performed.

In the writing process, for example, the word line WL2 is grounded by the word line driver 207, and the bit line BL2 is electrically connected to the control unit 203 by the bit line driver 205. Then, the control unit 203 applies a writing voltage pulse $V_w$ to the bit line BL2. Here, the writing voltage pulse $V_w$ to be applied to the memory cell MC22 has, for example, a voltage value of −4.5 V and a pulse width of 500 ns.

Since the writing voltage pulse $V_w$ having a negative polarity is applied to the memory cell MC22, the memory cell MC22 is set to the low resistance state corresponding to the data "1".

<3.2.3 Erasing Process>

In the high resistance mode ([0] write mode), the erasing process is performed.

In the erasing process, for example, the bit line BL2 is grounded by the bit line driver 205, and the word line WL2 is electrically connected to the control unit 203 by the word line driver 207. Then, the control unit 203 applies an erasing voltage pulse $V_e$ to the word line WL2. Here, the erasing voltage pulse $V_e$ to be applied to the memory cell MC22 has, for example, a voltage value of +5.5 V and a pulse width of 500 ns.

Since the erasing voltage pulse $V_e$ having a positive polarity is applied to the memory cell MC22, the memory cell MC22 is set to the first high resistance state corresponding to the data "0".

<3.2.4 Read Mode>

In the read mode, for example, the bit line BL2 is grounded by the bit line driver 205, and the word line WL2 is electrically connected to the control unit 203 by the word line driver 207. Then, the control unit 203 applies a reading voltage $V_r$ to the word line WL2. Here, the reading voltage $V_r$ to be applied to the memory cell MC22 has, for example, a voltage value of +3.5 V.

Upon application of the reading voltage $V_r$ to the memory cell MC22, a current having a magnitude corresponding to the resistance value of the memory cell MC22 flows between the bit line BL2 and the word line WL2. The bit line driver 205 measures the current, and outputs, to the control unit 203, the signal $I_{READ}$ indicating the measured current value.

The control unit 203 calculates a resistance state of the memory cell MC22 using the current value indicated by the signal $I_{READ}$ and the voltage value of the reading voltage $V_r$. When the memory cell MC22 is in the low resistance state, the data written in the memory cell MC22 is obviously "1". In contrast, when the memory cell MC22 is in the first high resistance state, the data written in the memory cell MC22 is obviously "0".

As described above, since the non-volatile memory device 200 performs the initialization process in the initialization mode with application of a voltage pulse having the polarity identical to that of the voltage pulse used in the erasing process in the high resistance mode, reduction in the resistance value of the variable resistance element 10 included in each of the memory cells starts from the value of the initial resistance R0 and ends in the first high resistance state RH.

In other words, in the initialization process, the resistance value of the variable resistance element 10 is reduced from a resistance value in the initial resistance R0 to a resistance value in the second high resistance state RH' while controlling the current that flows through the memory cells, using the variable resistance elements 10 that are maintained to have a resistance values higher than or equal to the resistance value in the first high resistance state RH'. Thus, the divided voltage of the voltage pulse to the current steering element 20 and the current that flows through the memory cells can be more suppressed than the case where the initialization process is performed using the voltage pulse having a reversed polarity. Thus, it is possible to reduce the risk that the current steering element 20 included in each of the memory cells may be destroyed.

Although the structure in which one of the bit lines and the word lines are grounded and a predetermined voltage pulse is applied to the other is described hereinbefore, the structure may be the one in which different voltage pulses are applied to the bit lines and the word lines so that a potential difference between the bit lines and the word lines becomes a predetermined voltage.

Although the examples of operations and circuit structures in each of the modes are described above, the present invention is not limited by such operations and circuit structures. In other words, other than the above methods and circuit structures, the present invention also includes a method for performing the initialization process with application of a voltage pulse having the polarity identical to that of the voltage pulse used for changing the variable resistance element to the high resistance state, and a circuit structure that allows implementation of such a method.

INDUSTRIAL APPLICABILITY

The method for driving a non-volatile memory element and a non-volatile memory device according to the present invention are applicable to any electronic devices, such as personal computers and mobile telephones.

REFERENCE SIGNS LIST

1 First electrode
2 Second electrode
3 Variable resistance layer
3a First transition metal oxide layer
3b Second transition metal oxide layer
4 Load resistor
5 Power source
6 Third electrode
7 Fourth electrode
8 Semiconductor layer
10 Variable resistance element
20 Current steering element (bidirectional diode)
100 Non-volatile memory element
103a, 103b, 103c, 303, 703a, 703b, 703c, 703d lower electrode
104a, 104b, 104c, 304, 704a, 704b First tantalum oxide layer
105a, 105b, 105c, 305, 705a, 705b Second tantalum oxide layer
107a, 107b, 107c, 309, 709a, 709b, 709c, 709d Upper electrode
108a, 108b, 108c Conductive layer
200 Non-volatile memory device
201 Memory cell array
202 Address buffer
203 Control unit
204 Column decoder
205 Bit line driver
204 Row decoder
207 Word line driver
210 Driving unit
706c, 706d Oxygen-deficient hafnium oxide layer
WL1, WL2, WL3 Word line
BL1, BL2, BL3 Bit line
MC11, MC12, MC13, MC21, MC22, MC23, MC31, MC32, MC33
Memory cell

The invention claimed is:

1. A method for driving a non-volatile memory element including (i) a non-volatile variable resistance element and (ii) a current steering element connected in series with the variable resistance element and having bidirectional rectifying characteristics with respect to an applied voltage,
the variable resistance element including:
a first electrode;
a second electrode; and
a variable resistance layer (i) disposed between and in contact with the first electrode and the second electrode, (ii) reversibly changing between a high resistance state and a low resistance state with application of electrical signals having different polarities between the first electrode and the second electrode, and (iii) capable of maintaining one of the high resistance state and the low resistance state in a non-volatile manner even after the application of the electrical signals is stopped,
the variable resistance layer including stacked layers including:
a first transition metal oxide layer comprising an oxygen-deficient transition metal oxide and in contact with the first electrode; and
a second transition metal oxide layer in contact with the second electrode and comprising a transition metal oxide lower in oxygen deficiency than the oxygen-deficient transition metal oxide, the current steering element including:
a third electrode;
a fourth electrode; and
a current steering layer disposed between and in contact with the third electrode and the fourth electrode,
wherein with application of electrical signals having different polarities between the third electrode and the fourth electrode, (i) the current steering element is OFF when an absolute value of a voltage amplitude of the electrical signals is smaller than a predetermined threshold, and (ii) the current steering element is ON when the absolute value is larger than or equal to the predetermined threshold, and
the current steering element has characteristics of being destroyed when a current larger than or equal to a predetermined current-steering-element breakdown current with a positive polarity flows between the third electrode and the fourth electrode,
the method comprising:
changing a resistance value of the variable resistance layer from a first high resistance state to the low resistance state by applying, to the non-volatile memory element, a voltage pulse having a polarity with which the second electrode has a negative polarity with respect to the first electrode of the variable resistance element;
changing the resistance value of the variable resistance layer from the low resistance state to the first high resistance state by applying, to the non-volatile memory element, a voltage pulse having a polarity with which the second electrode has a positive polarity with respect to the first electrode; and
reducing, after the non-volatile memory element is manufactured, a resistance value of the variable resistance element from an initial resistance value to a resistance value in a second high resistance state with application of a predetermined variable-resistance-element initialization current with a positive polarity by applying, to the non-volatile memory element, a voltage pulse having the polarity with which the second electrode has the positive polarity with respect to the first electrode, the initial resistance value being higher than a resistance value in the first high resistance state, the resistance value in the second high resistance state being lower than the initial resistance value, and the predetermined variable-resistance-element initialization current being smaller than the predetermined current-steering-element breakdown current.

2. The method according to claim 1,
wherein an interface between the second transition metal oxide layer and the second electrode is substantially flat.

3. The method according to claim 1,
wherein in the reducing, after the voltage pulse having the polarity with which the second electrode has the positive polarity with respect to the first electrode is applied to the non-volatile memory element, the variable resistance element is maintained in the second high resistance state having the resistance value higher than or equal to the resistance value in the first high resistance state to suppress a current that flows through the non-volatile memory element.

4. The method according to claim 1,
wherein the second electrode included in the variable resistance element has a thickness smaller than or equal to a predetermined upper limit, according to a material comprised in the second electrode, the upper limit being determined in advance based on a relationship between an initial resistance and a thickness of an electrode comprising the material and included in a variable resistance element.

5. The method according to claim 4,
wherein the second electrode comprises iridium or platinum that has a thickness between 1 nm and 10 nm inclusive.

6. The method according to claim 1,
wherein the first transition metal oxide layer comprises a tantalum oxide having a composition expressed as $TaO_x$, where $0.8 \leq x \leq 1.9$, and
the second transition metal oxide layer comprises a tantalum oxide having a composition expressed as $TaO_y$, where $y \geq 2.1$.

7. The method according to claim 1,
wherein the current steering element is a bidirectional diode in which the current steering layer is interposed between electrodes that form a Schottky barrier junction with the current steering layer, the current steering layer comprising a silicon nitride having a composition expressed as $SiN_z$, where $0 < z \leq 0.85$.

8. A non-volatile memory device, comprising:
a non-volatile memory element including (i) a non-volatile variable resistance element and (ii) a current steering element connected in series with the variable resistance element and having bidirectional rectifying characteristics with respect to an applied voltage; and
a driving unit,
the variable resistance element including:
a first electrode;
a second electrode; and
a variable resistance layer (i) disposed between and in contact with the first electrode and the second electrode, (ii) reversibly changing between a high resistance state and a low resistance state with application of electrical signals having different polarities between the first electrode and the second electrode, and (iii) capable of maintaining one of the high resistance state and the low resistance state in a non-volatile manner even after the application of the electrical signals is stopped,
the variable resistance layer including stacked layers including:
a first transition metal oxide layer comprising an oxygen-deficient transition metal oxide and in contact with the first electrode; and
a second transition metal oxide layer in contact with the second electrode and comprising a transition metal oxide lower in oxygen deficiency than the oxygen-deficient transition metal oxide,
the current steering element including:
a third electrode;
a fourth electrode; and
a current steering layer disposed between and in contact with the third electrode and the fourth electrode,
wherein with application of electrical signals having different polarities between the third electrode and the fourth electrode, (i) the current steering element is OFF when an absolute value of a voltage amplitude of the electrical signals is smaller than a predetermined threshold, and (ii) the current steering element is ON when the absolute value is larger than or equal to the predetermined threshold, and
the current steering element has characteristics of being destroyed when a current larger than or equal to a predetermined current-steering-element breakdown current with a positive polarity flows between the third electrode and the fourth electrode, the driving unit is configured to:
change a resistance value of the variable resistance layer from a first high resistance state to the low resistance state by applying, to the non-volatile memory element, a voltage pulse having a polarity with which the second electrode has a negative polarity with respect to the first electrode of the variable resistance element;
change the resistance value of the variable resistance layer from the low resistance state to the first high resistance state by applying, to the non-volatile memory element, a voltage pulse having a polarity with which the second electrode has a positive polarity with respect to the first electrode; and
reduce, after the non-volatile memory element is manufactured, a resistance value of the variable resistance element from an initial resistance value to a resistance value in a second high resistance state with application of a predetermined variable-resistance-element initialization current with a positive polarity by applying, to the non-volatile memory element, a voltage pulse having the polarity with which the second electrode has the positive polarity with respect to the first electrode, the initial resistance value being higher than a resistance value in the first high resistance state, the resistance value in the second high resistance state being lower than the initial resistance value, and the predetermined variable-resistance-element initialization current being smaller than the predetermined current-steering-element breakdown current.

9. The non-volatile memory device according to claim 8, wherein an interface between the second transition metal oxide layer and the second electrode is substantially flat.

10. The non-volatile memory device according to claim 8, wherein after the voltage pulse having the polarity with which the second electrode has the positive polarity with respect to the first electrode is applied to the non-volatile memory element, when the driving unit reduces the resistance value of the variable resistance element, the variable resistance element is maintained to have a resistance value larger than or equal to the resistance value in the first high resistance state to suppress a current that flows through the non-volatile memory element.

11. The non-volatile memory device according to claim 8, wherein the second electrode included in the variable resistance element has a thickness smaller than or equal to a predetermined upper limit, according to a material comprised in the second electrode, the upper limit being determined in advance based on a relationship between an initial resistance and a thickness of an electrode comprising the material and included in a variable resistance element.

12. The non-volatile memory device according to claim 11, wherein the second electrode comprises iridium or platinum that has a thickness between 1 nm and 10 nm inclusive.

13. The non-volatile memory device according to claim 8, wherein the first transition metal oxide layer comprises a tantalum oxide having a composition expressed as $TaO_x$, where $0.8 \leq x \leq 1.9$, and
the second transition metal oxide layer comprises a tantalum oxide having a composition expressed as $TaO_y$, where $y \geq 2.1$.

14. The non-volatile memory device according to claim 8, wherein the current steering element is a bidirectional diode in which the current steering layer is interposed between electrodes that form a Schottky barrier junction with the current steering layer, the current steering layer comprising a silicon nitride having a composition expressed as $SiN_z$, where $0 < z \leq 0.85$.

* * * * *